US010818715B2

United States Patent
Iwata et al.

(10) Patent No.: US 10,818,715 B2
(45) Date of Patent: Oct. 27, 2020

(54) SOLID STATE IMAGING DEVICE AND MANUFACTURING METHOD THEREOF

(71) Applicant: CANON KABUSHIKI KAISHA, Tokyo (JP)

(72) Inventors: Junji Iwata, Tokyo (JP); Yoichi Wada, Yokohama (JP); Yoichiro Handa, Tokyo (JP); Daichi Seto, Yokohama (JP); Hideyuki Ito, Kawasaki (JP); Ginjiro Toyoguchi, Tokyo (JP); Hajime Ikeda, Yokohama (JP); Masahiro Kobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/013,166

(22) Filed: Jun. 20, 2018

(65) Prior Publication Data

US 2018/0374886 A1    Dec. 27, 2018

(30) Foreign Application Priority Data

Jun. 26, 2017    (JP) .................................. 2017-124067
May 15, 2018    (JP) .................................. 2018-093808

(51) Int. Cl.
*H01L 27/146*    (2006.01)
*H01L 31/112*    (2006.01)
(Continued)

(52) U.S. Cl.
CPC .. *H01L 27/14627* (2013.01); *H01L 27/14643* (2013.01); *H01L 27/14683* (2013.01);
(Continued)

(58) Field of Classification Search
CPC ........... H01L 27/14603; H01L 27/1463; H01L 27/14609; H01L 27/14623;
(Continued)

(56) References Cited

U.S. PATENT DOCUMENTS 7,462,810 B2    12/2008    Kobayashi
7,928,477 B2    4/2011    Kobayashi
(Continued)

FOREIGN PATENT DOCUMENTS

JP    2014-165286    9/2014

OTHER PUBLICATIONS

U.S. Appl. No. 15/914,505, filed Mar. 7, 2018, by: Hajime Ikeda et al.
(Continued)

*Primary Examiner* — Jonathan Han
(74) *Attorney, Agent, or Firm* — Venable LLP

(57) ABSTRACT

According to one aspect of the invention, provided is a solid state imaging device having a pixel including a photoelectric conversion portion provided in a semiconductor substrate. The photoelectric conversion portion includes first and second charge accumulation region of a first conductivity type provided at a first depth of the semiconductor substrate and spaced apart from each other by a first gap, and first and second semiconductor region of a second conductivity type provided at a second depth located under the first depth of the semiconductor substrate and extend over the first charge accumulation region, the first gap, and the second charge accumulation region in a planar view. At the second depth, an impurity concentration of the second conductivity type in a region under the first gap is higher than an impurity concentration of the second conductivity type in a region under the first and second charge accumulation regions.

14 Claims, 36 Drawing Sheets

(51) Int. Cl.
  *H01L 27/148*  (2006.01)
  *H01L 31/103*  (2006.01)
  *H01L 31/0352* (2006.01)

(52) U.S. Cl.
  CPC .. *H01L 27/14812* (2013.01); *H01L 31/03529* (2013.01); *H01L 31/103* (2013.01); *H01L 31/112* (2013.01)

(58) Field of Classification Search
  CPC .......... H01L 27/14641; H01L 27/1461; H04N 5/37452; H04N 5/335
  USPC ................. 257/292, 225, 291, 436; 348/294, 348/E3.029; 438/57, 144; 250/208.1
  See application file for complete search history.

(56) References Cited

U.S. PATENT DOCUMENTS

| | | | |
|---|---|---|---|
| 7,935,995 B2 | 5/2011 | Watanabe | |
| 8,045,034 B2 | 10/2011 | Shibata | |
| 8,063,351 B2 | 11/2011 | Kobayashi | |
| 8,174,604 B2 | 5/2012 | Shibata | |
| 8,222,682 B2 | 7/2012 | Watanabe | |
| 8,259,206 B1 | 9/2012 | Shibata | |
| 8,357,956 B2 | 1/2013 | Kobayashi | |
| 8,456,559 B2 | 6/2013 | Yamashita | |
| 8,552,353 B2 | 10/2013 | Kobayashi | |
| 8,648,944 B2 | 2/2014 | Iwata | |
| 8,697,500 B2 | 4/2014 | Iwata | |
| 8,723,232 B2 | 5/2014 | Kobayashi | |
| 8,736,005 B2 * | 5/2014 | Kobayashi | H01L 27/1461 257/432 |
| 8,884,391 B2 | 11/2014 | Fudaba | |
| 8,885,082 B2 | 11/2014 | Noda | |
| 8,921,900 B2 | 12/2014 | Iida | |
| 9,124,833 B2 | 9/2015 | Toyoguchi | |
| 9,147,708 B2 | 9/2015 | Okita | |
| 9,153,610 B2 | 10/2015 | Kobayashi | |
| 9,276,027 B2 | 3/2016 | Okita | |
| 9,344,653 B2 | 5/2016 | Shimotsusa | |
| 9,419,038 B2 | 8/2016 | Kobayashi | |
| 9,445,026 B2 | 9/2016 | Kobayashi | |
| 9,538,112 B2 | 1/2017 | Wada | |
| 9,543,340 B2 | 1/2017 | Iwata | |
| 9,548,328 B2 | 1/2017 | Hasegawa | |
| 9,596,426 B2 | 3/2017 | Nanda | |
| 9,716,849 B2 | 7/2017 | Kobayashi | |
| 9,768,213 B2 | 9/2017 | Soda | |
| 9,818,794 B2 | 11/2017 | Okita | |
| 9,876,975 B2 | 1/2018 | Yoshida | |
| 9,894,295 B2 | 2/2018 | Kawabata | |
| 9,906,743 B2 | 2/2018 | Shimotsusa | |
| 9,906,747 B2 | 2/2018 | Araoka | |
| 9,979,916 B2 | 5/2018 | Hiyama | |
| 10,009,560 B2 | 6/2018 | Kobayashi | |
| 10,021,321 B2 | 7/2018 | Kawabata | |
| 2008/0219033 A1 | 9/2008 | Nishikawa | |
| 2011/0136291 A1 | 6/2011 | Iwata | |
| 2013/0187210 A1 * | 7/2013 | Kobayashi | H01L 27/14612 257/292 |
| 2014/0061436 A1 * | 3/2014 | Kobayashi | H01L 27/14612 250/208.1 |
| 2016/0322406 A1 | 11/2016 | Kobayashi | |
| 2016/0360126 A1 * | 12/2016 | Soda | H01L 27/1461 |
| 2017/0078557 A1 | 3/2017 | Kawabata | |
| 2017/0078604 A1 | 3/2017 | Kobayashi | |
| 2017/0212221 A1 | 7/2017 | Goden | |
| 2017/0289478 A1 | 10/2017 | Kobayashi | |
| 2017/0301719 A1 | 10/2017 | Iwata | |
| 2017/0359538 A1 | 12/2017 | Kobayashi | |
| 2018/0026073 A1 | 1/2018 | Tsuboi | |
| 2018/0098013 A1 | 4/2018 | Yoshida | |
| 2018/0131885 A1 | 5/2018 | Shimotsusa | |
| 2018/0139402 A1 | 5/2018 | Araoka | |
| 2018/0151616 A1 | 5/2018 | Sekine | |
| 2018/0197907 A1 | 7/2018 | Wada | |
| 2018/0213167 A1 | 7/2018 | Miki | |

OTHER PUBLICATIONS

U.S. Appl. No. 15/955,146, filed Apr. 17, 2018, by: Takeru Ohya et al.
U.S. Appl. No. 15/990,361, filed May 25, 2018, by: Ginjiro Toyoguchi.
U.S. Appl. No. 16/040,144, filed Jul. 19, 2018, by: Haijime Ikeda et al.

* cited by examiner

FRONT VIEW

TOP VIEW

BACKSIDE VIEW

SOLID STATE IMAGING DEVICE AND MANUFACTURING METHOD THEREOF

BACKGROUND OF THE INVENTION

Field of the Invention

The present invention relates to a solid state imaging device having a plurality of charge accumulation regions.

Description of the Related Art

In recent years, a solid state imaging device having a plurality of photoelectric conversion regions for a single micro-lens is realized. According to such a configuration, a phase difference signal can be acquired based on a light passing through a single micro-lens to perform focus detection with a phase difference scheme.

On the other hand, improvement of the sensitivity of a photoelectric conversion region has been studied. In a solid state imaging device of Japanese Patent Application Laid-Open No. 2014-165286, a semiconductor region for suppressing depletion layer expansion is provided under a pair of charge accumulation regions that accumulate signal charges generated in a photoelectric conversion region. Further, a gap for guiding signal charges generated in a deeper position than a semiconductor region to the charge accumulation region is provided in the semiconductor region, and thereby the sensitivity of a pixel is improved.

Japanese Patent Application Laid-Open No. 2014-165286 does not provide any consideration for the structure of an isolation portion between a plurality of photoelectric conversion regions when a plurality of photoelectric conversion regions are provided to a single micro-lens. In particular, no consideration has been made for the structure of an isolation portion that suppresses a leak current of charges from one of the plurality of photoelectric conversion regions to the other.

SUMMARY OF THE INVENTION

According to one aspect of the present invention, provided is a solid state imaging device having a pixel including a photoelectric conversion portion provided in a semiconductor substrate. The photoelectric conversion portion includes a first charge accumulation region of a first conductivity type and a second charge accumulation region of the first conductivity type, the first charge accumulation region and the second charge accumulation region being provided at a first depth of the semiconductor substrate, the first charge accumulation region and the second charge accumulation region being spaced apart from each other by a first gap, and a first semiconductor region of a second conductivity type and a second semiconductor region of the second conductivity type, the first semiconductor region and the second semiconductor region being provided at a second depth located under the first depth of the semiconductor substrate, each of the first semiconductor region and the second semiconductor region extending over the first charge accumulation region, the first gap, and the second charge accumulation region in a planar view. At the second depth, an impurity concentration of the second conductivity type in a region under the first gap is higher than an impurity concentration of the second conductivity type in a region under the first charge accumulation region and the second charge accumulation region.

According to another aspect of the present invention, provided is a solid state imaging device having a pixel including a photoelectric conversion portion provided in a semiconductor substrate. The photoelectric conversion portion includes a first charge accumulation region of a first conductivity type and a second charge accumulation region of the first conductivity type, the first charge accumulation region and the second charge accumulation region being provided at a first depth of the semiconductor substrate, the first charge accumulation region and the second charge accumulation region being spaced apart from each other by a first gap, and a first semiconductor region of a second conductivity type and a second semiconductor region of the second conductivity type, the first semiconductor region and the second semiconductor region being provided at a second depth located under the first depth of the semiconductor substrate, the first semiconductor region and the second semiconductor region being spaced apart from each other by a second gap. At the second depth, each of the first semiconductor region, the second semiconductor region, and the second gap extends over the first charge accumulation region, the first gap, and the second charge accumulation region in a planar view. In the first gap, a width of a portion located above the second gap, the width being along a direction in which the second gap extends, is larger than a width of portions located above the first semiconductor region and the second semiconductor region, the width being along the direction.

Further features of the present invention will become apparent from the following description of exemplary embodiments with reference to the attached drawings.

DESCRIPTION OF THE EMBODIMENTS

Figure 1:
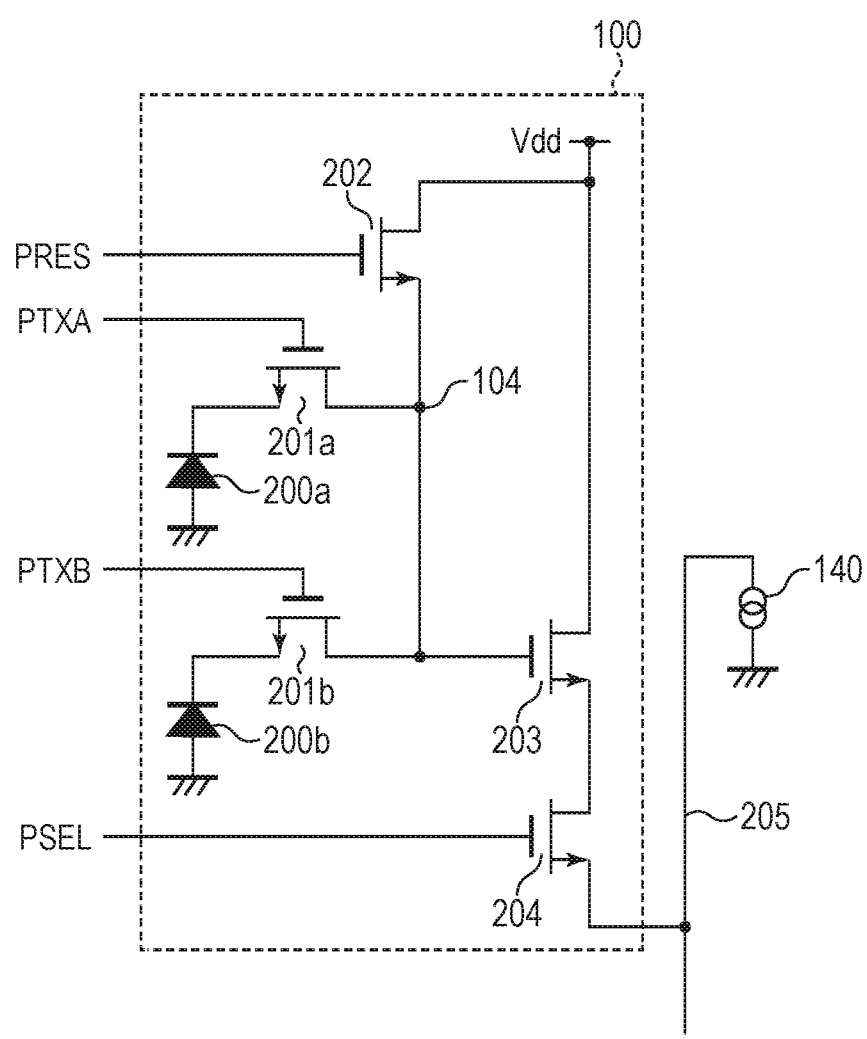
FIG. 1 is an equivalent circuit diagram illustrating a configuration of a pixel of a solid state imaging device according to some embodiments of the present invention.

FIG. 1 is an equivalent circuit diagram illustrating a configuration of a pixel 100 in a solid state imaging device according to some embodiments of the present invention. The pixel 100 illustrated in FIG. 1 has photoelectric conversion regions 200a and 200b, transfer transistors 201a and 201b, a reset transistor 202, an amplification transistor 203, and a selection transistor 204.

The transfer transistors 201a and 201b, the reset transistor 202, and the selection transistor 204 are controlled by control signals PTXA, PTXB, PRES, and PSEL output from a vertical scanning circuit (not shown), respectively. For example, a MOS transistor is used for each of these transistors. Note that, while an example in which N-MOSs are used is illustrated in FIG. 1, P-MOSs may be used. In this case, the high level and the low level of control signals are opposite.

The solid state imaging device according to some embodiments of the present invention has a photoelectric conversion portion provided on a semiconductor substrate. A pair of photoelectric conversion regions 200a and 200b formed in the photoelectric conversion portion photoelectrically convert an incident light, respectively. The transfer transistors 201a and 201b transfer signal charges generated in the photoelectric conversion regions 200a and 200b to an input node, respectively. The input node here refers to a floating diffusion region 104 formed at a connection point of three terminals of the drain terminals of the transfer transistor 201a and 201b, the source terminal of the reset transistor 202, and the gate terminal of the amplification transistor 203. The floating diffusion region 104 holds signal charges transferred from the photoelectric conversion regions 200a and 200b.

Note that, while FIG. 1 illustrates the configuration in which signal charges generated in the photoelectric conversion regions 200a and 200b are transferred to the common floating diffusion region 104, such a configuration is also possible that transfers signal charges generated in the photoelectric conversion regions 200a and 200b to different floating diffusion regions, respectively.

The amplification transistor 203 forms a source follower circuit together with a constant current source 140 and amplifies a voltage based on the amount of signal charges held in the floating diffusion region 104 to output the amplified voltage as a pixel signal. The selection transistor 204 connects the pixel 100 selected by the control signal PSEL to a column output line 205. As a result, a pixel signal based on the amount of signal charges held in the floating diffusion region 104 of the selected pixel 100 is output to the column output line 205. The reset transistor 202 is connected to the voltage Vdd to reset signal charges held in the floating diffusion region 104.

Figure 2:
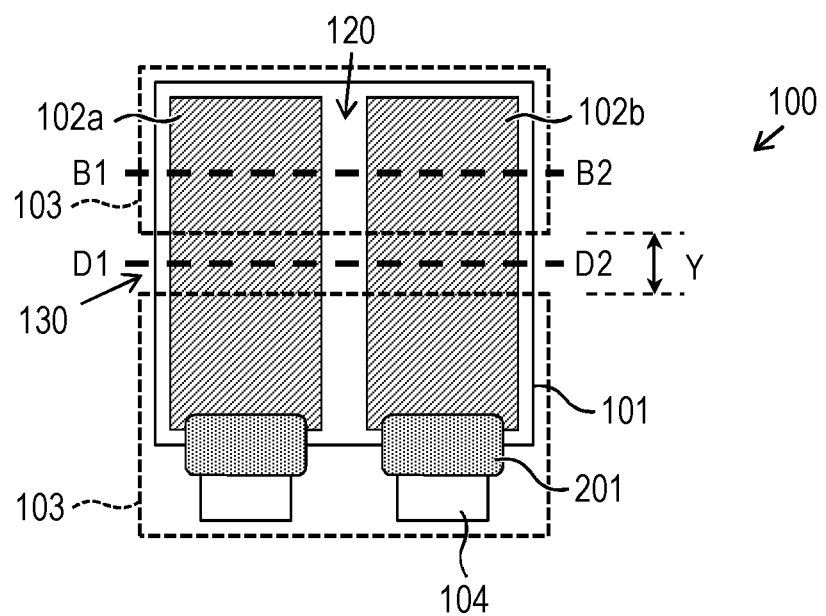
FIG. 2 is a plan view schematically illustrating the structure of a pixel of the solid state imaging device according to some embodiments of the present invention.

FIG. 2 is a plan view schematically illustrating the structure of the pixel 100 of the solid state imaging device according to some embodiments of the present invention. The pixel 100 illustrated in FIG. 2 has N-type charge accumulation regions 102a and 102b, P-type semiconductor region 103, a floating diffusion region 104, and transfer transistors 201a and 201b. Note that FIG. 2 illustrates only transfer gate electrodes 201 of the transfer transistors 201a and 201b.

The charge accumulation regions 102a and 102b and the semiconductor region 103 are arranged in an electric active region 101. In the following description, an example of a case where electrons are carriers will be illustrated, holes can be carriers. In this case, the polarity of N-type and P-type are opposite. Further, in the following description, one of the P-type and the N-type of semiconductor may be referred to as a first conductivity type, and the other of the P-type and the N-type of semiconductor may be referred to as a second conductivity type.

The PN junction formed at the boundary between the N-type charge accumulation regions 102a and 102b and the P-type region such as the semiconductor region 103 forms the photoelectric conversion regions 200a and 200b illustrated in FIG. 1. Signal charges generated by a light that has transmitted through a single micro-lens entering the photoelectric conversion regions 200a and 200b are accumulated in the charge accumulation regions 102a and 102b, respectively. As illustrated in FIG. 2, the charge accumulation regions 102a and 102b are spaced apart from each other by a first gap 120. The pixel 100 outputs a first signal based on signal charges accumulated in the charge accumulation region 102a and a second signal based on signal charges accumulated in the charge accumulation region 102b. Thereby, focus detection of a phase difference scheme can be performed by using the first signal and the second signal.

The P-type semiconductor region 103 is provided under the N-type charge accumulation regions 102a and 102b and suppresses expansion of depletion layer in the depth direction. The P-type semiconductor region 103 has a second gap 130 having a width Y along a broken line D1-D2. Here, of the region of the semiconductor region 103 illustrated in FIG. 2, the region on the upper side of the second gap 130 is the first semiconductor region, and the region on the underside of the second gap 130 is the second semiconductor region. In this situation, both the first semiconductor region and the second semiconductor region extend over the charge accumulation region 102a, the first gap 120, and the charge accumulation region 102b. Appropriate setting of the size, the shape, and the P-type impurity concentration of the second gap 130 allows signal charges generated under the P-type semiconductor region 103 to be guided to the charge accumulation regions 102a and 102b. This can improve the sensitivity of the pixel 100.

Note that, while the upper first semiconductor region and the lower second semiconductor region are spaced apart from each other by the second gap 130 in FIG. 2, the first semiconductor region and the second semiconductor region may be partially connected to each other as illustrated in the first embodiment described later, for example. Further, while the direction along the first gap 120 and the direction along the second gap 130 are desirably orthogonal to each other in a planar view as illustrated in FIG. 2, it is not necessarily limited to such a configuration. The direction along the first gap 120 and the direction along the second gap 130 may intersect with each other at an angle in the planar view.

Figure 3A:
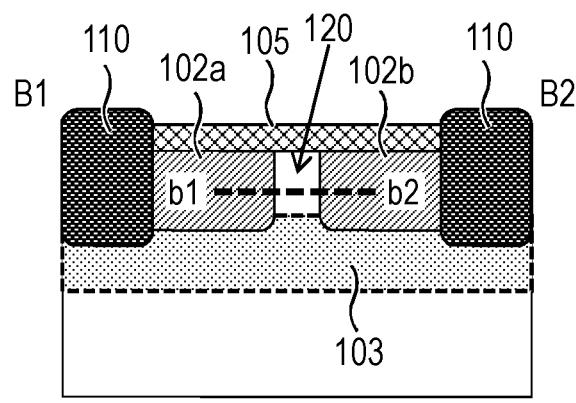
FIG. 3A is a first sectional view schematically illustrating the structure of the pixel of the solid state imaging device according to some embodiments of the present invention.
Figure 4A:
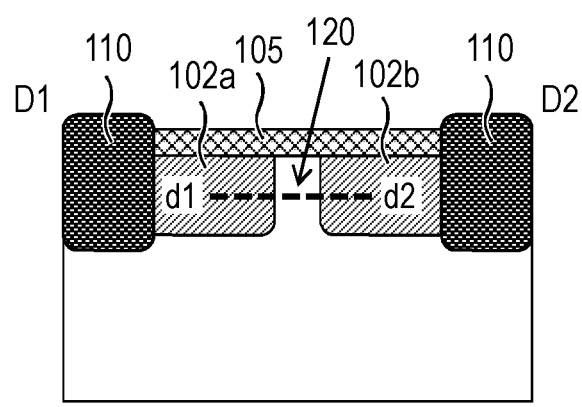
FIG. 4A is a second sectional view schematically illustrating the structure of the pixel of the solid state imaging device according to some embodiments of the present invention.

FIG. 3A and FIG. 4A are sectional views schematically illustrating the structure of the pixel 100 of the solid state imaging device according to some embodiments of the present invention. FIG. 3A illustrates a cross section taken along the broken line B1-B2 of the pixel 100 illustrated in FIG. 2. FIG. 4A illustrates a cross section taken along the broken line D1-D2 of the pixel 100 illustrated in FIG. 2. In each diagram, those having a function that is the same as or corresponds to the function in FIG. 2 are labeled with the same references.

An element isolation region 110 electrically isolates the neighboring pixels 100 from each other. The element isolation region 110 is formed by using Local Oxidation of Silicon (LOCOS), Shallow Trench Isolation (STI), or the like, for example. A P-type impurity region 105 for suppressing a dark current due to an interface is provided on the N-type charge accumulation regions 102a and 102b formed at a first depth along the broken line b1-b2 of FIG. 3A (or broken line d1-d2 of FIG. 4A). Further, the p-type semiconductor region 103 is provided at a second depth deeper than the first depth.

Figure 3B:
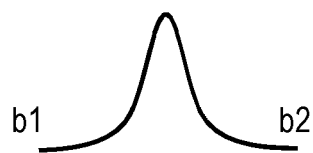
FIG. 3B is a potential diagram inside a semiconductor substrate.
Figure 4B:
FIG. 4B is a potential diagram inside a semiconductor substrate.

FIG. 3B illustrates a potential barrier along the broken line b1-b2 of FIG. 3A. Further, FIG. 4B illustrates a potential barrier along the broken line d1-d2 of FIG. 4A. The height of the potential barrier along the broken line b1-b2 illustrated in FIG. 3A is determined by a diffusion component of the P-type impurity from the semiconductor region 103 to the surface layer side and a diffusion component of the P-type impurity from the impurity region 105 in the depth direction. In contrast, the height of the potential barrier along the broken line d1-d2 illustrated in FIG. 4A is determined by only the diffusion component of the P-type impurity from the impurity region 105 in the depth direction. Thus, the potential barrier along the broken line d1-d2 is smaller than the potential barrier along the broken line b1-b2.

In the configuration having a pair of the first charge accumulation region and the second charge accumulation region (the charge accumulation regions 102a and 102b) within a single pixel 100 as illustrated above, a small potential barrier of the first gap 120 causes a leak current into the first gap 120. This results in a smaller saturation charge amount of the charge accumulation regions 102a and 102b and causes a reduction in focus detection accuracy in the phase difference scheme.

Thus, the potential barrier of the first gap 120 in an intersection region where the direction along the first gap 120 and the direction along the second gap 130 intersect with each other in the planar view is equal to or greater than the potential barrier in the remaining region of the first gap 120. Here, the expression "equal to" means that the heights are substantially the same. While the specific configuration will be illustrated in the embodiment described later, the P-type impurity concentration in a region under the first gap 120 is set higher than the P-type impurity concentration in a region under the charge accumulation regions 102a and 102b at the second depth. Alternatively, in the first gap 120, the width of a portion located above the second gap 130 is set larger than the width of a portion located above the semiconductor region 103, where both widths are along a direction in which the second gap 130 extends. This can reduce a leak current between the plurality of charge accumulation regions 102a and 102b of the pixel 100.

Preferred embodiments of the present invention will now be described in detail in accordance with the accompanying drawings. Note that the present invention is not limited to the following embodiments but can be changed as appropriate within a scope not departing from the spirit thereof. Further, in each drawing, those having the same or corresponding function are labeled with the same reference, and the description thereof may be omitted or simplified.

First Embodiment

Figure 5:
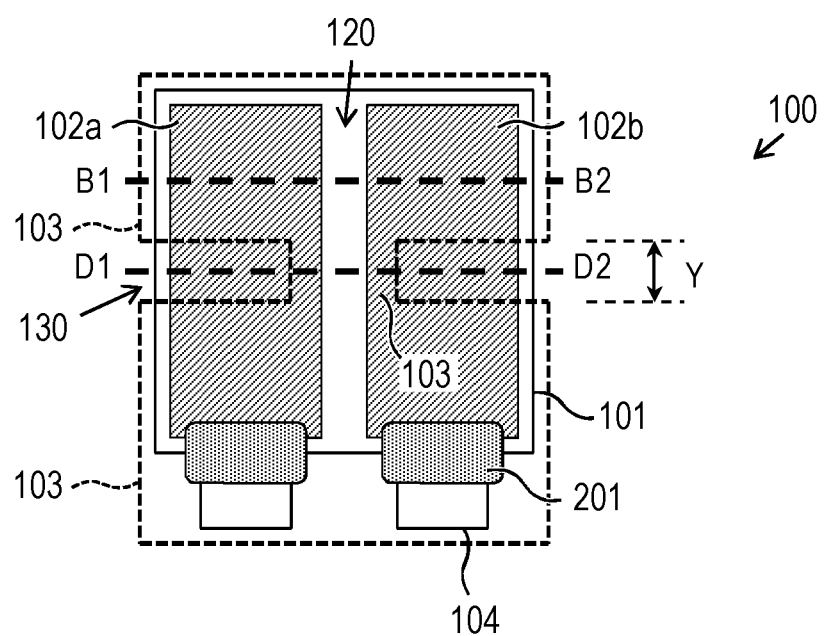
FIG. 5 is a plan view schematically illustrating the structure of the pixel of the solid state imaging device according to a first embodiment.

FIG. 5 is a plan view schematically illustrating the structure of the pixel 100 of a solid state imaging device according to a first embodiment. In the pixel 100 of the present embodiment illustrated in FIG. 5, the semiconductor region 103 is continuous without the second gap 130 in the intersecting region where the direction along the first gap 120 and the direction along the second gap 130 intersect with each other in the planar view. Since other configurations are the same as those of FIG. 2 previously described, the description thereof will be omitted.

Figure 6A:
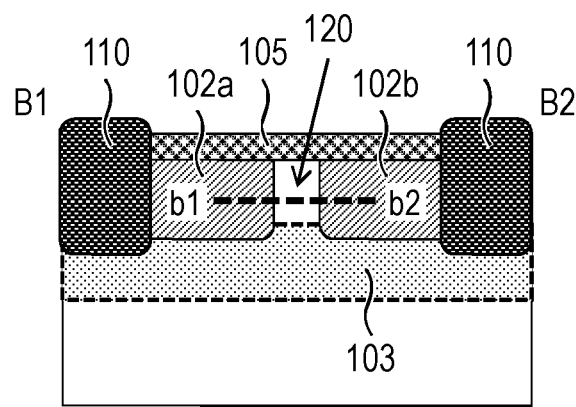
FIG. 6A is a first sectional view schematically illustrating the structure of the pixel of the solid state imaging device according to the first embodiment.
Figure 7A:
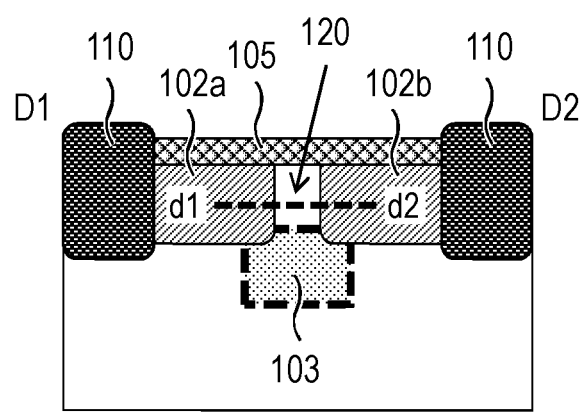
FIG. 7A is a second sectional view schematically illustrating the structure of the pixel of the solid state imaging device according to the first embodiment.

FIG. 6A and FIG. 7A are sectional views schematically illustrating the structure of the pixel 100 of the solid state imaging device according to the first embodiment. FIG. 6A illustrates a cross section taken along the broken line B1-B2 of the pixel 100 illustrated in FIG. 5. Further, FIG. 7A illustrates a cross section taken along the broken line D1-D2 of the pixel 100 illustrated in FIG. 5. In each diagram, those having a function that is the same as or corresponds to the function in FIG. 5 are labeled with the same references.

Figure 6B:
FIG. 6B is a potential diagram inside a semiconductor substrate.
Figure 7B:
FIG. 7B is a potential diagram inside a semiconductor substrate.

FIG. 6B illustrates a potential barrier along the broken line b1-b2 of FIG. 6A. Further, FIG. 7B illustrates a potential barrier along the broken line d1-d2 of FIG. 7A. The height of the potential barrier along the broken line b1-b2 illustrated in FIG. 6A is determined by a diffusion component of the P-type impurity from the semiconductor region 103 to the surface layer side and a diffusion component of the P-type impurity from the impurity region 105 in the depth direction. The same applies to the height of the potential barrier along the broken line d1-d2 illustrated in FIG. 7A.

Therefore, in the present embodiment, the potential barrier along the broken line d1-d2 is equal to the potential barrier along the broken line b1-b2. Here, the expression "equal to" means that the heights of potential barriers are substantially the same. According to such a configuration, a leak current between the plurality of charge accumulation regions 102a and 102b of the pixel 100 can be reduced.

Figure 8:
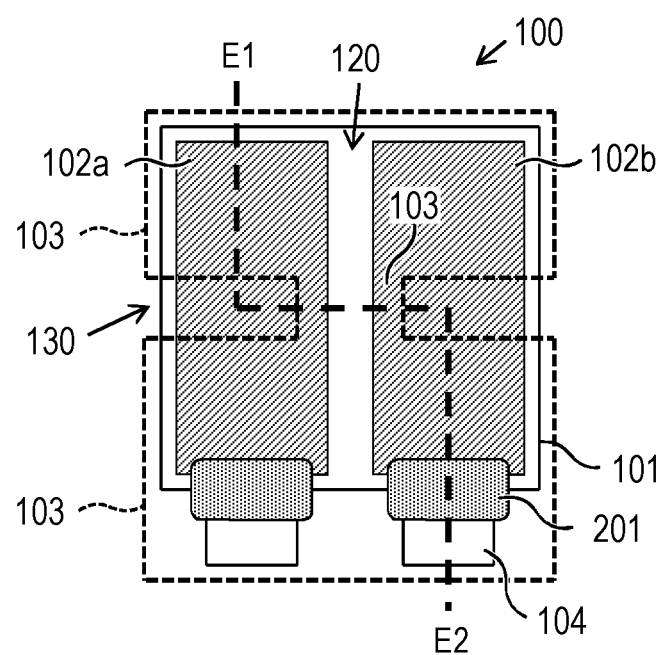
FIG. 8 is a diagram illustrating a manufacturing method of the solid state imaging device according to the first embodiment.

Next, a manufacturing method of the pixel 100 of the present embodiment illustrated in FIG. 5 will be described with reference to FIG. 8 and FIG. 9A to FIG. 9F. FIG. 8 is a diagram that is the same as the plan view of the pixel 100 illustrated in FIG. 5 and illustrates a manufacturing method of the solid state imaging device according to the first embodiment. Further, FIG. 9A to FIG. 9F are diagrams schematically illustrating respective steps of the manufacturing method of the solid state imaging device according to the first embodiment. FIG. 9A to FIG. 9F illustrate cross sections in respective steps of the pixel 100 taken along the broken line E1-E2 illustrated in FIG. 8.

Figure 9A:
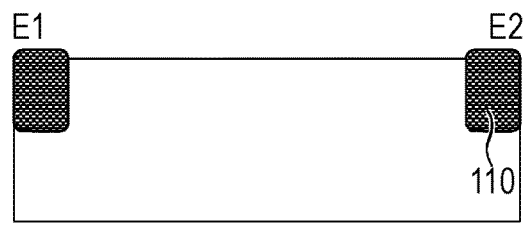
FIG. 9A, FIG. 9B, FIG. 9C, FIG. 9D, FIG. 9E, and FIG. 9F are diagrams schematically illustrating respective steps of the manufacturing method of the solid state imaging device according to the first embodiment.
Figure 9B:
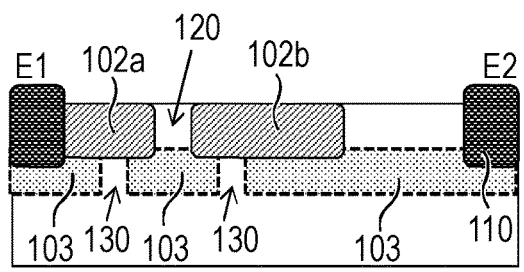

In FIG. 9A, the element isolation region 110 is formed in an N-type semiconductor substrate. Subsequently, in FIG. 9B, the P-type semiconductor region 103 is formed in the N-type semiconductor substrate. Further, the N-type charge accumulation regions 102a and 102b are formed on the P-type semiconductor region 103. Here, in FIG. 9A and FIG. 9B, the semiconductor region 103 does not have the second gap 130 in an intersection region where the direction along the first gap 120 and the direction along the second gap 130 intersect with each other in the planar view. Thereby, at the second depth, the P-type impurity concentration in a region under the first gap 120 is higher than the P-type impurity concentration in a region under the charge accumulation regions 102a and 102b.

Figure 9C:
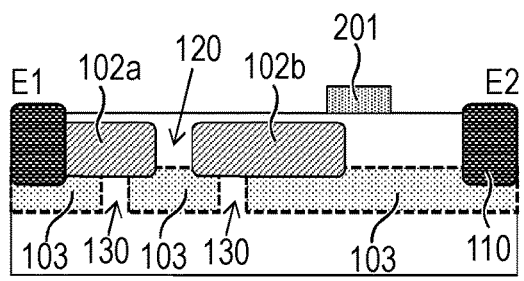

In FIG. 9C, a transfer gate electrode 201 is formed. Subsequently, in FIG. 9D, the P-type impurity region 105 for suppressing a dark current due to an interface is formed on the N-type charge accumulation regions 102a and 102b. Further, an N-type floating diffusion region 104 is formed. Then, in FIG. 9E, a wiring interlayer insulating film 301, a contact plug 302, a first wiring layer 303, and the like are formed. Furthermore, in FIG. 9F, a wiring interlayer via 304, a second wiring layer 305, and the like are formed, and thereby the pixel 100 of the present embodiment illustrated in FIG. 5 is manufactured.

As described above, in a pixel of the present embodiment, the semiconductor region is continuous without having the second gap in an intersection region where the direction along the first gap and the direction along the second gap intersect with each other in the planar view. According to such a configuration, a solid state imaging device having an isolation portion that suitably suppresses a leak current of charges from one of the plurality of photoelectric conversion regions to the other and a manufacturing method thereof can be provided. Further, in the present embodiment, since it is not necessary to increase a pattern forming step, the pixel can be manufactured by using simpler steps.

Second Embodiment

Figure 10:
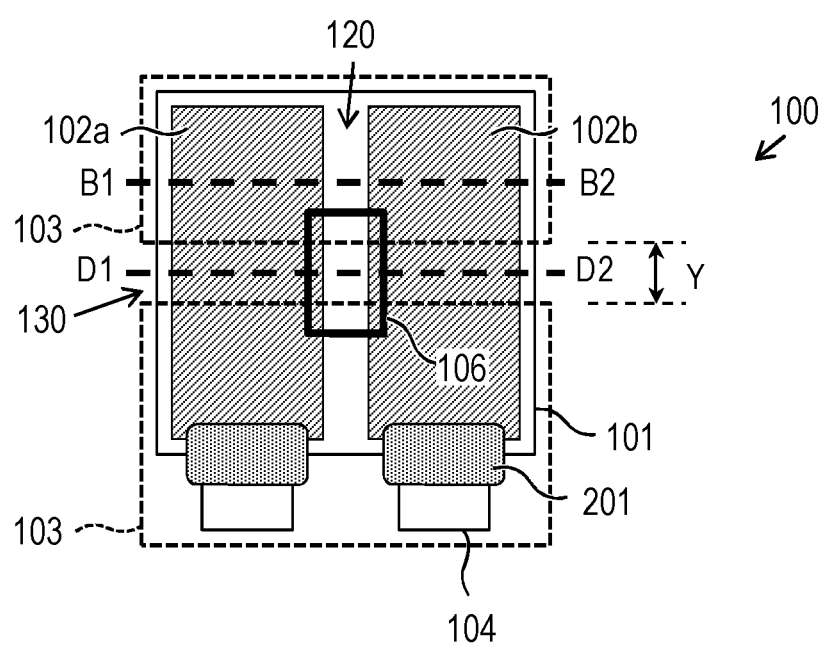
FIG. 10 is a plan view schematically illustrating the structure of a pixel of a solid state imaging device according to a second embodiment.

FIG. 10 is a plan view schematically illustrating the structure of the pixel 100 of a solid state imaging device according to a second embodiment. The pixel 100 of the present embodiment illustrated in FIG. 10 has a P-type impurity region 106 at a position which is located in an intersection region where the direction along the first gap 120 and the direction along the second gap 130 intersect with each other in the planar view and is shallower than the semiconductor region 103. Since other configurations are the same as those of FIG. 2 previously described, the description thereof will be omitted.

Figure 11A:
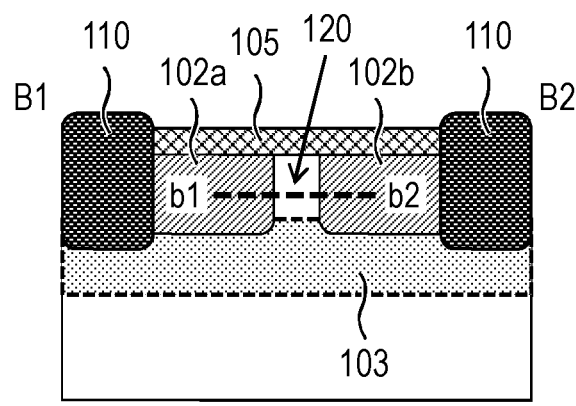
FIG. 11A is a first sectional view schematically illustrating the structure of the pixel of the solid state imaging device according to the second embodiments.
Figure 12A:
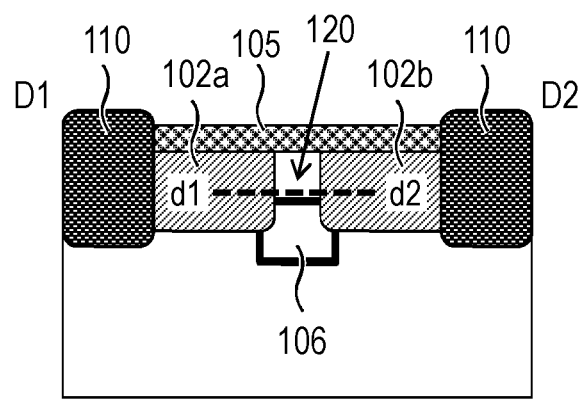
FIG. 12A is a second sectional view schematically illustrating the structure of the pixel of the solid state imaging device according to the second embodiments.

FIG. 11A and FIG. 12A are sectional views schematically illustrating the structure of the pixel 100 of the solid state imaging device according to the second embodiment. FIG. 11A illustrates a cross section taken along the broken line B1-B2 of the pixel 100 illustrated in FIG. 10. FIG. 12A illustrates a cross section taken along the broken line D1-D2 of the pixel 100 illustrated in FIG. 10. In each diagram, those having a function that is the same as or corresponds to the function in FIG. 10 are labeled with the same references.

Figure 11B:
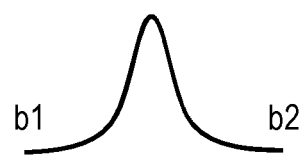
FIG. 11B is a potential diagram inside a semiconductor substrate.
Figure 12B:
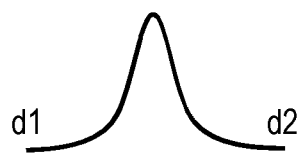
FIG. 12B is a potential diagram inside a semiconductor substrate.

FIG. 11B illustrates a potential barrier along the broken line b1-b2 of FIG. 11A. Further, FIG. 12B illustrates a potential barrier along the broken line d1-d2 of FIG. 12A.

The height of the potential barrier along the broken line b1-b2 illustrated in FIG. 11A is determined by a diffusion component of the P-type impurity from the semiconductor region 103 to the surface layer side and a diffusion component of the P-type impurity from the impurity region 105 in the depth direction. On the other hand, the height of the potential barrier along the broken line d1-d2 illustrated in FIG. 12A is determined by a diffusion component of the P-type impurity from the impurity region 106 to the surface layer side and a diffusion component of the P-type impurity from the impurity region 105 in the depth direction.

Therefore, in the present embodiment, the potential barrier along the broken line d1-d2 can be equal to or greater than the potential barrier along the broken line b1-b2 by appropriately controlling the P-type impurity of the impurity region 106. According to such a configuration, a leak current between the plurality of charge accumulation regions 102a and 102b of the pixel 100 can be further reduced.

Figure 13:
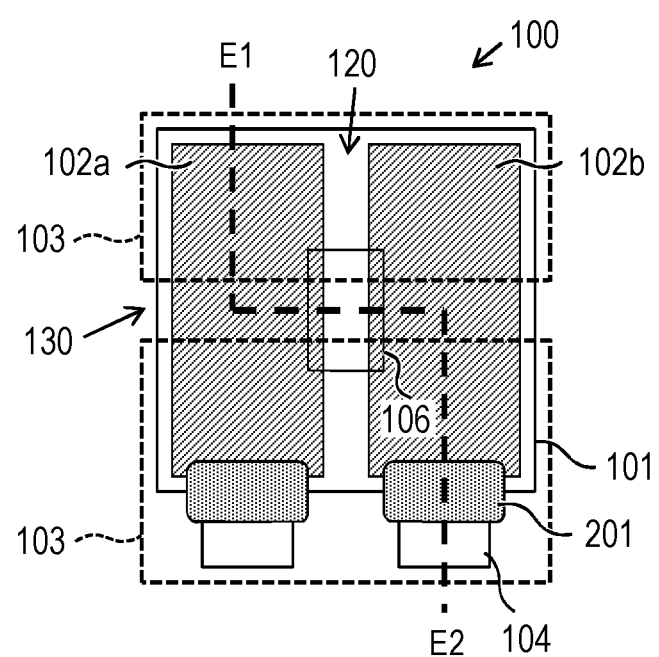
FIG. 13 is a diagram illustrating a manufacturing method of the solid state imaging device according to the second embodiment.
Figure 14B:
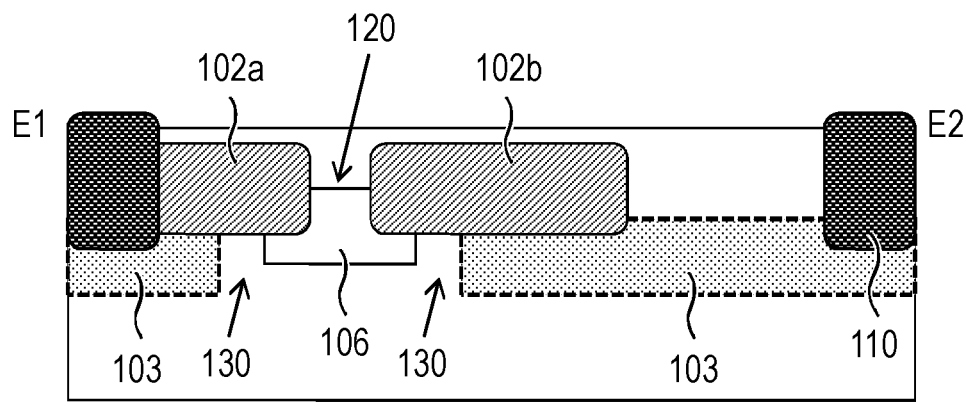
FIG. 14B and FIG. 14F are diagrams schematically illustrating respective steps of the manufacturing method of the solid state imaging device according to the second embodiment.
Figure 14F:
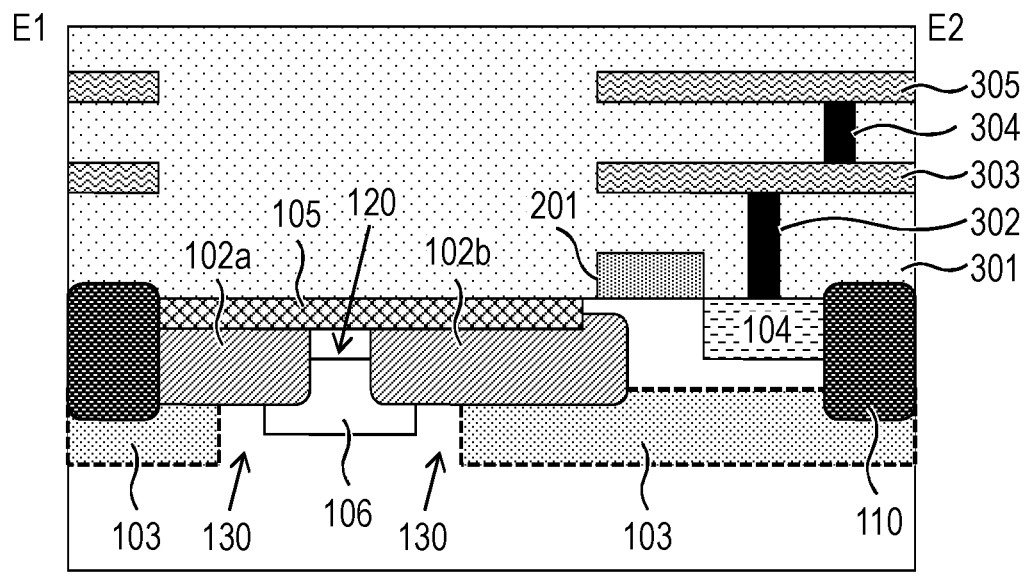

Next, a manufacturing method of the pixel 100 of the present embodiment illustrated in FIG. 10 will be described with reference to FIG. 13, FIG. 14B, and FIG. 14F. FIG. 13 is a diagram that is the same as the plan view of the pixel 100 illustrated in FIG. 10 and illustrates a manufacturing method of the solid state imaging device according to the second embodiment. Further, FIG. 14B and FIG. 14F are diagrams schematically illustrating respective steps of the manufacturing method of the solid state imaging device according to the second embodiment. FIG. 14B and FIG. 14F illustrate cross sections in respective steps of the pixel 100 taken along the broken line E1-E2 illustrated in FIG. 13.

The element isolation region 110 is formed in an N-type semiconductor substrate in a similar manner to FIG. 9A. Subsequently, in FIG. 14B, the P-type semiconductor region 103 is formed in the N-type semiconductor substrate. Further, the P-type impurity region 106 is formed at a position which is located in an intersection region where the direction along the first gap 120 and the direction along the second gap 130 intersect with each other in the planar view and is shallower than the semiconductor region 103. Then, the N-type charge accumulation regions 102a and 102b are formed on the P-type semiconductor region 103. These steps may be performed in parallel. Thereby, at the second depth, the P-type impurity concentration in the region under the first gap 120 is higher than the P-type impurity concentration in the region under the charge accumulation regions 102a and 102b.

Figure 9D:
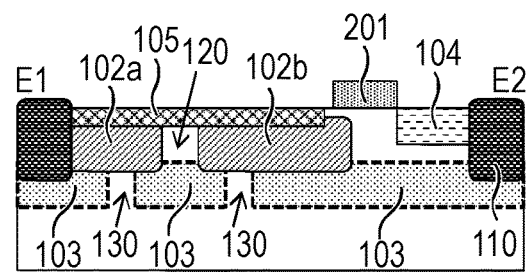
Figure 9E:
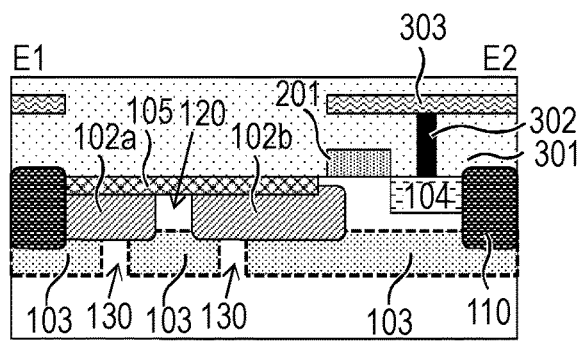
Figure 9F:
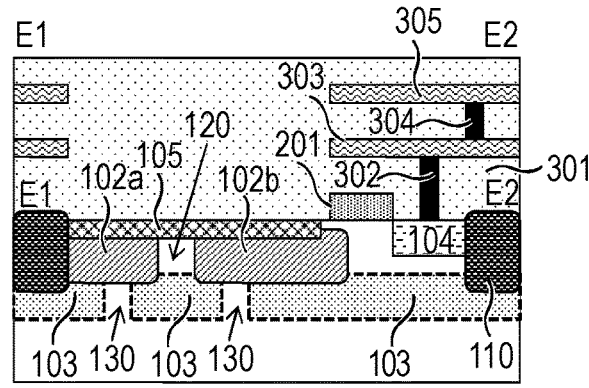

Subsequently, in a similar manner to FIG. 9C and FIG. 9D, the P-type impurity region 105 for suppressing a dark current due to an interface is formed on the N-type charge accumulation regions 102a and 102b. Further, the N-type floating diffusion region 104, the transfer gate electrode 201, and the like are formed. Then, in a similar manner to FIG. 9E, the wiring interlayer insulating film 301, the contact plug 302, the first wiring layer 303, and the like are formed. Furthermore, in FIG. 14F, the wiring interlayer via 304, the second wiring layer 305, and the like are formed, and thereby the pixel 100 of the present embodiment illustrated in FIG. 10 is manufactured.

As described above, a pixel of the present embodiment has a second conductivity type impurity region at a position which is located in an intersection region where the direction along the first gap and the direction along the second gap intersect with each other in the planar view and is shallower than the semiconductor region. According to such a configuration, a solid state imaging device having an isolation portion that suitably suppresses a leak current of charges from one of the plurality of photoelectric conversion regions to the other and a manufacturing method thereof can be provided.

Third Embodiment

Figure 15:
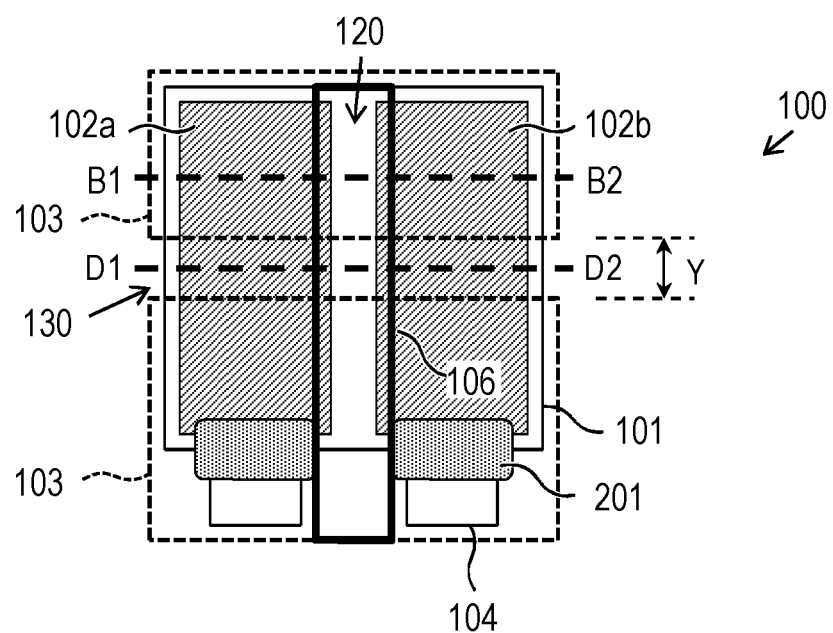
FIG. 15 is a plan view schematically illustrating the structure of a pixel of a solid state imaging device according to a third embodiment.

FIG. 15 is a plan view schematically illustrating the structure of the pixel 100 of a solid state imaging device according to a third embodiment. In the pixel 100 of the present embodiment illustrated in FIG. 15, the impurity region 106 illustrated in FIG. 10 is provided so as to penetrate the active region 101 along the first gap 120. Since other configurations are the same as those of FIG. 10 previously described, the description thereof will be omitted.

Figure 16A:
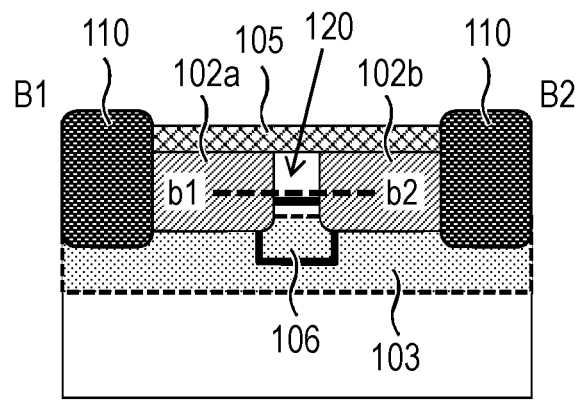
FIG. 16A is a first sectional view schematically illustrating the structure of the pixel of the solid state imaging device according to the third embodiments.
Figure 17A:
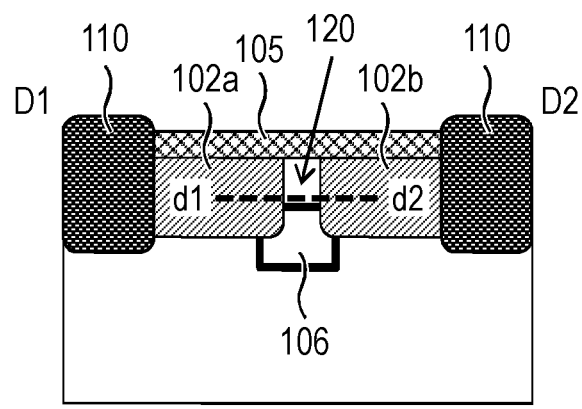
FIG. 17A is a second sectional view schematically illustrating the structure of the pixel of the solid state imaging device according to the third embodiments.

FIG. 16A and FIG. 17A are sectional views schematically illustrating the structure of the pixel 100 of the solid state imaging device according to the third embodiment. FIG. 16A illustrates a cross section taken along the broken line B1-B2 of the pixel 100 illustrated in FIG. 15. FIG. 17A illustrates a cross section taken along the broken line D1-D2 of the pixel 100 illustrated in FIG. 15. In each diagram, those having a function that is the same as or corresponds to the function in FIG. 15 are labeled with the same references.

Figure 16B:
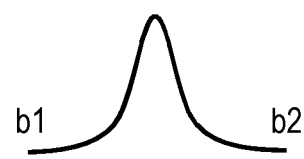
FIG. 16B is a potential diagram inside a semiconductor substrate.
Figure 17B:
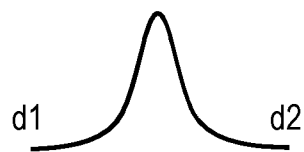
FIG. 17B is a potential diagram inside a semiconductor substrate.

FIG. 16B illustrates a potential barrier along the broken line b1-b2 of FIG. 16A. Further, FIG. 17B illustrates a potential barrier along the broken line d1-d2 of FIG. 17A. According to such a configuration, the potential barrier along the broken line d1-d2 is increased together with the potential barrier along the broken line b1-b2, and both the potential barriers become substantially equal to each other. Therefore, a leak current between the plurality of charge accumulation regions 102a and 102b of the pixel 100 can be further reduced.

Since the pixel 100 of the present embodiment illustrated in FIG. 15 can be manufactured by the same manufacturing method as that for the pixel 100 of the second embodiment previously described, the description thereof will be omitted.

As described above, in a pixel of the present embodiment, the impurity region 106 is formed along the first gap 120. According to such a configuration, a solid state imaging device having an isolation portion that suitably suppresses a leak current of charges from one of the plurality of photoelectric conversion regions to the other and a manufacturing method thereof can be provided.

Fourth Embodiment

Figure 18:
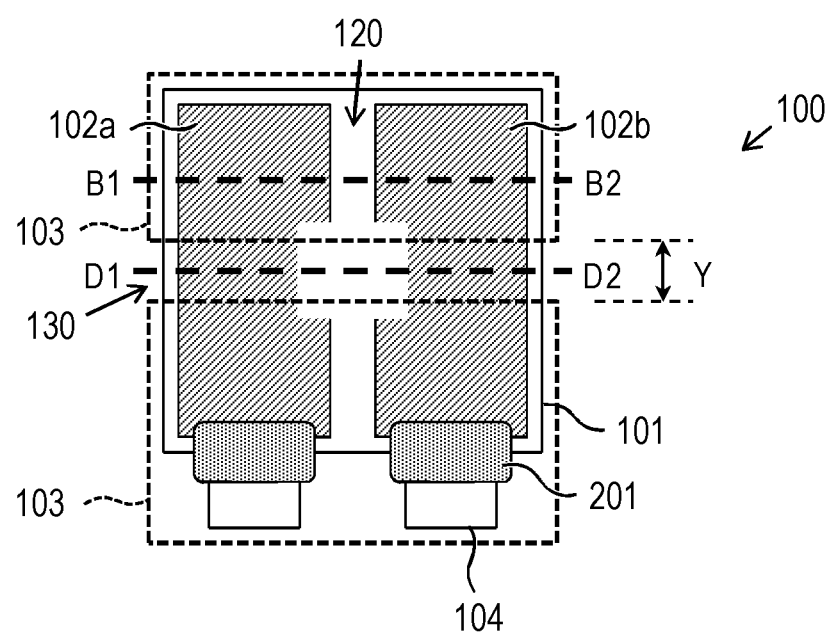
FIG. 18 is a plan view schematically illustrating the structure of a pixel of a solid state imaging device according to a fourth embodiment.

FIG. 18 is a plan view schematically illustrating the structure of the pixel 100 of a solid state imaging device according to a fourth embodiment. The semiconductor region 103 of the present embodiment illustrated in FIG. 18 is separated into the upper side first semiconductor region and the lower side second semiconductor region by the second gap 130. Both the separated upper side first semiconductor region and lower side second semiconductor region extend over the charge accumulation region 102a, the first gap 120, and the charge accumulation region 102b. Further, the second gap 130 also extends over the charge accumulation region 102a, the first gap 120, and the charge accumulation region 102b.

Figure 19A:
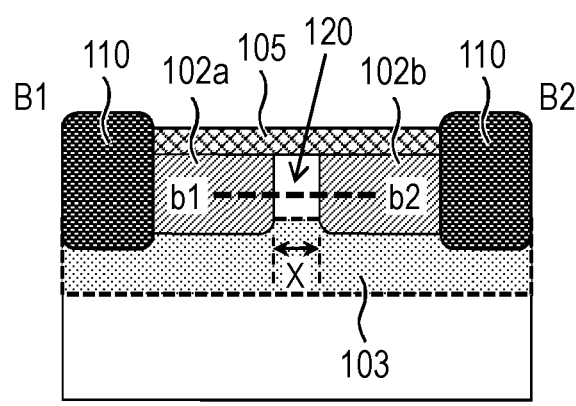
FIG. 19A is a first sectional view schematically illustrating the structure of the pixel of the solid state imaging device according to the fourth embodiments.
Figure 20A:
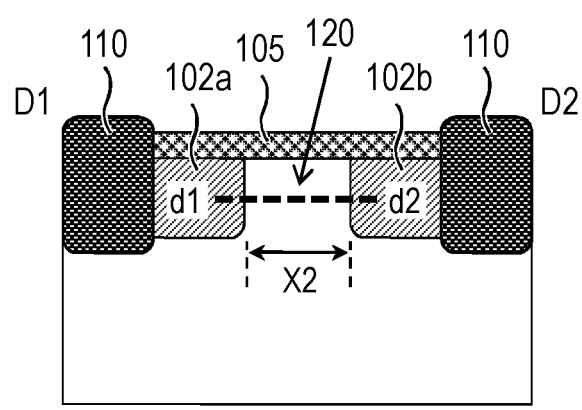
FIG. 20A is a second sectional view schematically illustrating the structure of the pixel of the solid state imaging device according to the fourth embodiments.

FIG. 19A and FIG. 20A are sectional views schematically illustrating the structure of the pixel 100 of the solid state imaging device according to the fourth embodiment. FIG. 19A illustrates a cross section taken along the broken line B1-B2 of the pixel 100 illustrated in FIG. 18. Further, FIG. 20A illustrates a cross section taken along the broken line D1-D2 of the pixel 100 illustrated in FIG. 18. In each diagram, those having a function that is the same as or corresponds to the function in FIG. 18 are labeled with the same references.

Figure 19B:
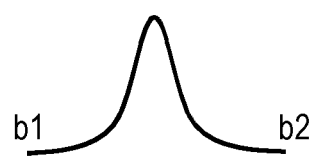
FIG. 19B is a potential diagram inside a semiconductor substrate.
Figure 20B:
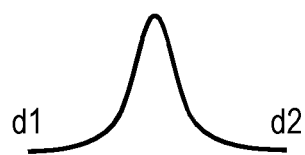
FIG. 20B is a potential diagram inside a semiconductor substrate.

FIG. 19B illustrates a potential barrier along the broken line b1-b2 of FIG. 19A. Further, FIG. 20B illustrates a potential barrier along the broken line d1-d2 of FIG. 20A.

In the pixel 100 of the present embodiment, as illustrated in FIG. 19A and FIG. 20A, a width X2 of the first gap 120 in the intersection region is wider than a width X of the first gap 120 in the remaining region. Here, the width X is a width of the first gap 120 of a portion located above the second gap 130 and the width is along in the direction in which the second gap 130 extends. Further, the width X2 is a width of the first gap 120 of a portion located above the semiconductor region 103 and the width is along the direction in which the second gap 130 extends. Such a configuration also allows the potential barrier along the broken line d1-d2 to be equal to or greater than the potential barrier along the broken line b1-b2. Therefore, a leak current between the plurality of charge accumulation regions 102a and 102b of the pixel 100 can be reduced.

Figure 21:
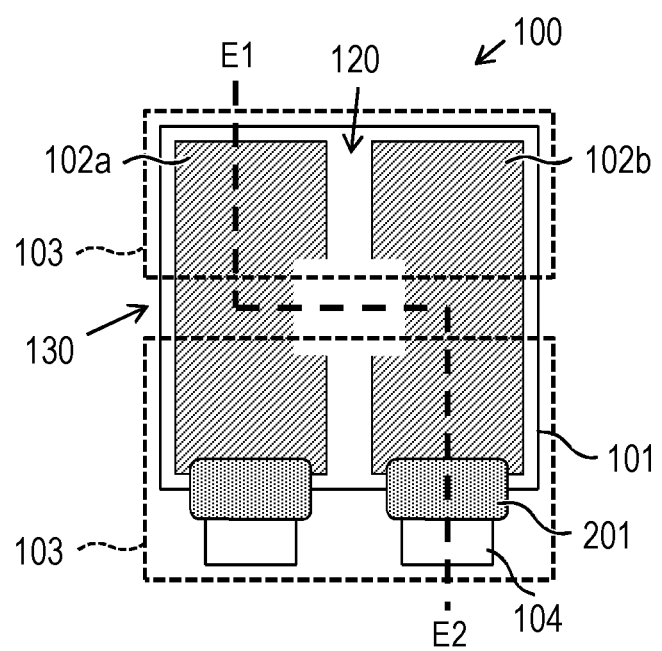
FIG. 21 is a diagram illustrating a manufacturing method of the solid state imaging device according to the fourth embodiment.
Figure 22B:
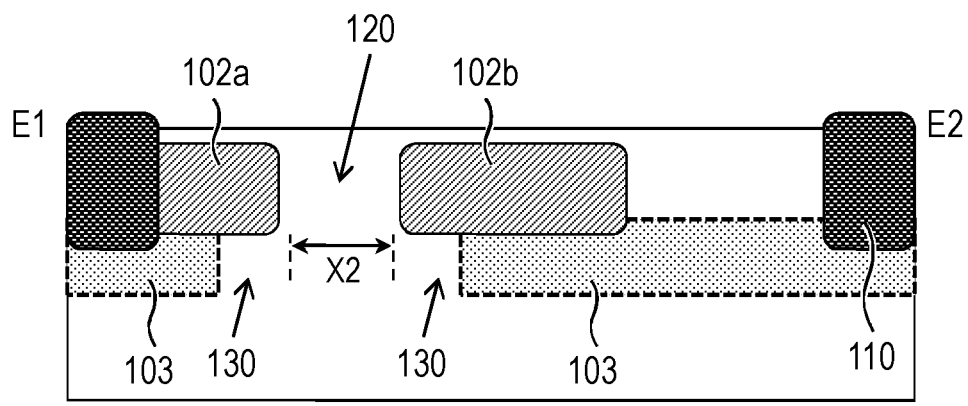
FIG. 22B and FIG. 22F are diagrams schematically illustrating respective steps of the manufacturing method of the solid state imaging device according to the fourth embodiment.
Figure 22F:
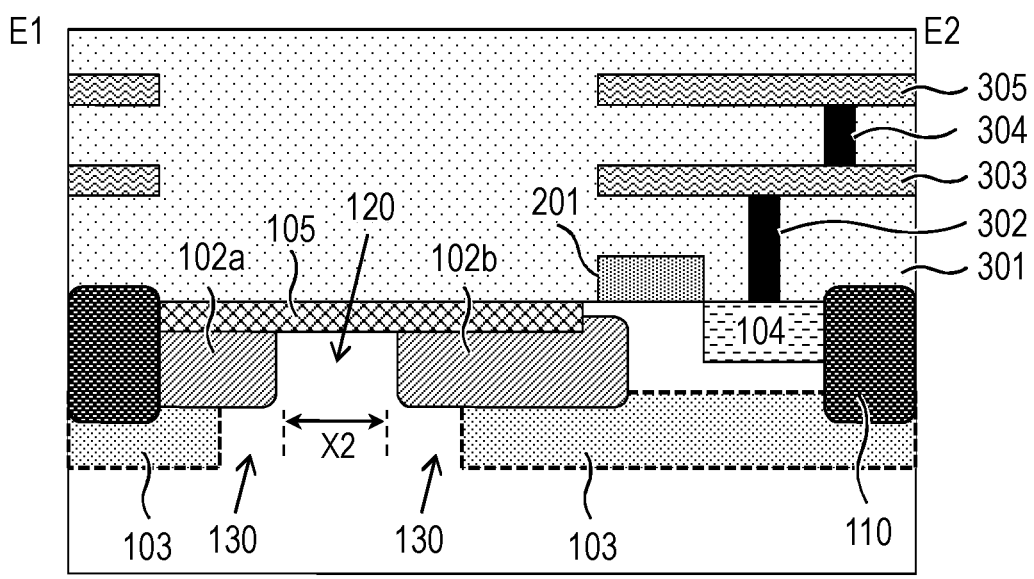

Next, a manufacturing method of the pixel 100 of the present embodiment illustrated in FIG. 18 will be described with reference to FIG. 21, FIG. 22B, and FIG. 22F. FIG. 21 is a diagram that is the same as the plan view of the pixel 100 illustrated in FIG. 18 and illustrates a manufacturing method of the solid state imaging device according to the fourth embodiment. Further, FIG. 22B and FIG. 22F are diagrams schematically illustrating respective steps of the manufacturing method of the solid state imaging device according to the fourth embodiment. FIG. 22B and FIG. 22F illustrate cross sections in respective steps of the pixel 100 taken along the broken line E1-E2 illustrated in FIG. 21.

The element isolation region 110 is formed in an N-type semiconductor substrate in a similar manner to FIG. 9A. Subsequently, in FIG. 22B, the P-type semiconductor region 103 is formed in the N-type semiconductor substrate. Then, the N-type charge accumulation regions 102a and 102b are formed on the P-type semiconductor region 103. Here, in FIG. 9A and FIG. 22B, the width X2 of the first gap 120 in the intersection region where the direction along the first gap 120 and the direction along the second gap 130 intersect with each other in the planar view is formed wider than the width X of the first gap 120 in the remaining region.

Subsequently, in a similar manner to FIG. 9C and FIG. 9D, the P-type impurity region 105 for suppressing a dark current due to an interface is formed on the N-type charge accumulation regions 102a and 102b. Further, the N-type floating diffusion region 104, the transfer gate electrode 201, and the like are formed. Then, in a similar manner to FIG. 9E, the wiring interlayer insulating film 301, the contact plug 302, the first wiring layer 303, and the like are formed. Furthermore, in FIG. 22F, the wiring interlayer via 304, the second wiring layer 305, and the like are formed, and thereby the pixel 100 of the present embodiment illustrated in FIG. 18 is manufactured.

As described above, in a pixel of the present embodiment, in the first gap, a width of a portion located above the second gap, in which the width is along a direction in which the second gap extends, is larger than a width of a portion located above the semiconductor region, in which the width is along the direction. Such a configuration also can provide a solid state imaging device and a manufacturing method thereof that can reduce a leak current between a plurality of charge accumulation regions of a pixel.

Fifth Embodiment

Figure 23:
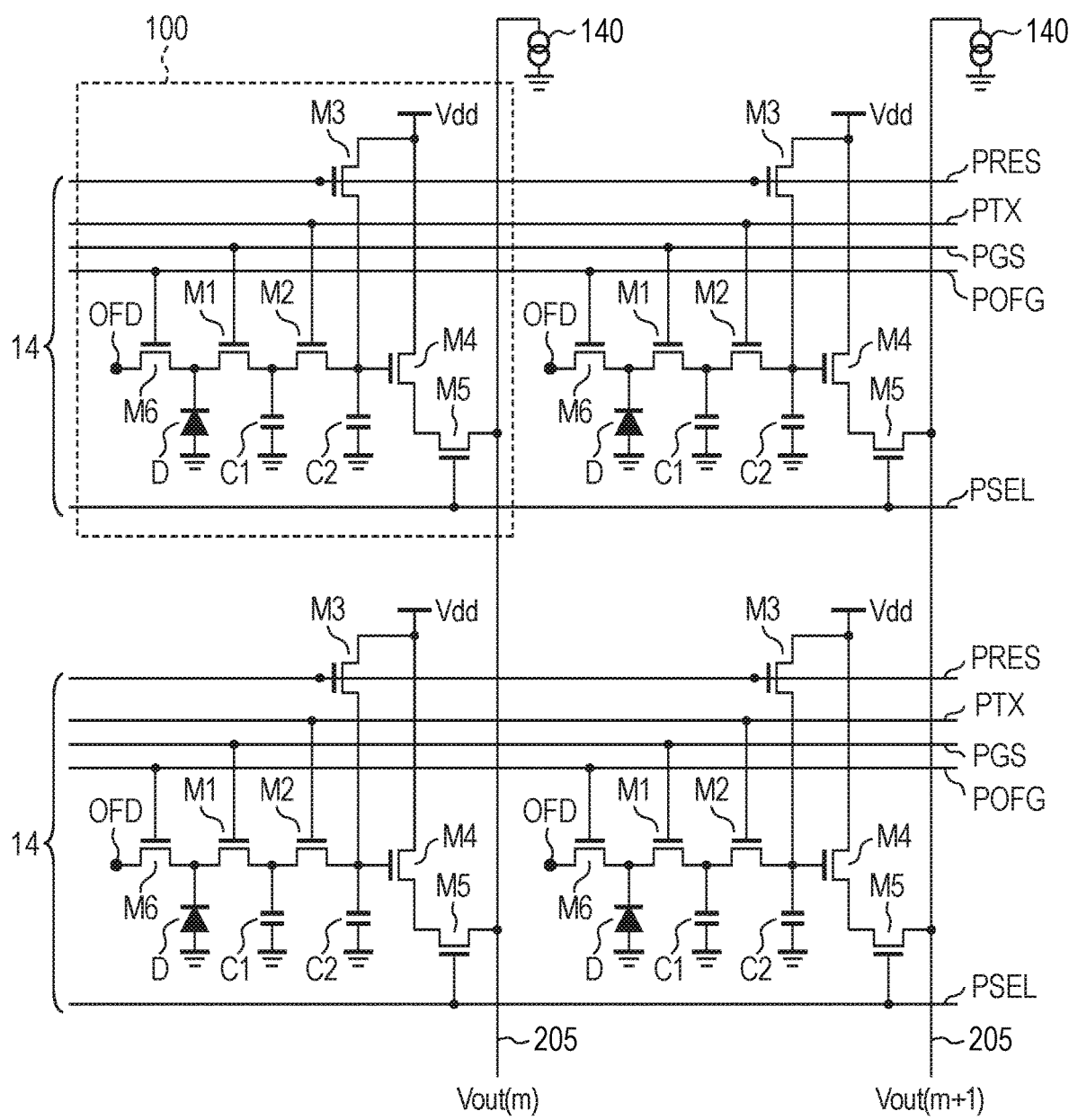
FIG. 23 is an equivalent circuit diagram illustrating a configuration of a pixel of a solid state imaging device according to a fifth embodiment.

Since the circuit configuration of a pixel of fifth to seventh embodiments is different from that illustrated in FIG. 1, a circuit configuration of a pixel is again described. FIG. 23 is an equivalent circuit diagram illustrating the configuration of pixels of a solid state imaging device according to the fifth embodiment. While FIG. 23 depicts four pixels 100 arranged in two rows by two columns out of the pixels 100 forming the pixel array included in the solid state imaging device, the number of pixels 100 is not limited in particular.

Each of the plurality of pixels 100 includes a photoelectric conversion region D, transfer transistors M1 and M2, a reset transistor M3, an amplification transistor M4, a selection transistor M5, and an overflow transistor M6. The photoelectric conversion region D is a photodiode, for example. Regarding the photodiode of the photoelectric conversion region D, the anode is connected to a ground voltage line, and the cathode is connected to the source of the transfer transistor M1 and the source of the overflow transistor M6. The drain of the transfer transistor M1 is connected to the source of the transfer transistor M2. A parasitic capacitance of the connection node of the drain of the transfer transistor M1 and the source of the transfer transistor M2 has a function as a holding portion of charges. In FIG. 23, this capacitance is represented as a capacitor element (C1). In the following description, this capacitor element may be denoted as a holding portion C1.

The drain of the transfer transistor M2 is connected to the source of the reset transistor M3 and the gate of the amplification transistor M4. The connection node of the drain of the transfer transistor M2, the source of the reset transistor M3, and the gate of the amplification transistor M4 is a so-called floating diffusion (floating diffusion: FD) region. The parasitic capacitance of the FD region (floating diffusion capacitor) has a function of a holding portion of charges. In FIG. 23, this capacitance is represented as a capacitor element (C2). In the following description, the FD region may be denoted as a holding portion C2. The drain of the reset transistor M3 and the drain of the amplification transistor M4 are connected to a power source voltage line that supplies a voltage Vdd. Note that the voltage supplied to the drain of the reset transistor M3 and the voltage supplied to the drain of the amplification transistor M4 may be the same as each other or may be different from each other. The source of the amplification transistor M4 is connected to the drain of the selection transistor M5. The source of the selection transistor M5 is connected to a column output line 205.

On each row of the pixel array, a control signal line 14 is arranged extending in the row direction (the horizontal direction in FIG. 23). The control signal line 14 on each row includes five control lines that supply control signals PRES, PTX, PGS, POFG, and PSEL. The control signals PRES, PTX, PGS, POFG, and PSEL are output from a vertical scanning circuit (not shown). The vertical scanning circuit may include a logic circuit such as a shift register, a address decoder, or the like.

The transfer transistor M1 is controlled by the control signal PGS. The transfer transistor M2 is controlled by the control signal PTX. The reset transistor M3 is controlled by the control signal PRES. The selection transistor M5 is controlled by the control signal PSEL. The overflow transistor M6 is controlled by the control signal POFG.

On each column of the pixel array, the column output line 205 is arranged extending in the column direction (the vertical direction in FIG. 23). The column output lines 205 are connected to the sources of the selection transistors M5 of the pixel 100 aligned in the column direction, respectively, and form a signal line common to these pixels 100. The column output line 205 is connected to a constant current source 140.

The photoelectric conversion region D converts (photoelectrically converts) an incident light to an amount of charges in accordance with the light amount thereof and accumulates the generated charges. The overflow transistor M6 drains charges accumulated in the photoelectric conversion region D to the drain. At this time, the node OFD that is the drain of the overflow transistor M6 may be connected to the power source voltage line.

The transfer transistor M1 transfers charges held in the photoelectric conversion region D to the holding portion C1. The transfer transistor M1 operates as a global electronic shutter. The holding portion C1 holds charges generated by the photoelectric conversion region D in a place different from the photoelectric conversion region D. The transfer transistor M2 transfers charges held by the holding portion C1 to the holding portion C2. The holding portion C2 holds charges transferred from the holding portion C1 and sets the voltage of the input node of the amplifier unit (gate of the amplification transistor M4) to a voltage in accordance with the capacitance thereof and the amount of the transferred charges.

The reset transistor M3 resets the holding portion C2 to a predetermined voltage in accordance with the voltage Vdd. At this time, it is possible to reset the holding portion C1 by turning on the transfer transistor M2 together. Furthermore, it is possible to reset the photoelectric conversion region D by turning on the transfer transistor M1 together.

The selection transistor M5 is for selecting the pixel 100 which outputs a signal to the column output line 205. The amplifier transistor M4 is configured such that the voltage Vdd is supplied to the drain and a bias current is supplied to the source from the constant current source 140 via the selection transistor M5 and forms an amplifier unit whose gate is the input node (a source follower circuit). This causes the amplification transistor M4 to output a signal Vout based on charges generated by an incident light to the column output line 205. Note that, in FIG. 23, the signal Vout is labeled with the corresponding column number (Vout(m), Vout(m+1)), respectively.

With such a configuration, charges generated by the photoelectric conversion region D during the holding portion C1 holding charges can be accumulated in the photoelectric conversion region D. This enables an image capturing operation such that exposure periods are matched among the plurality of pixels 100, namely, a so-called global electronic shutter operation to be performed. Note that electronic shutter is to electrically control accumulation of charges generated due to an incident light.

Figure 24:
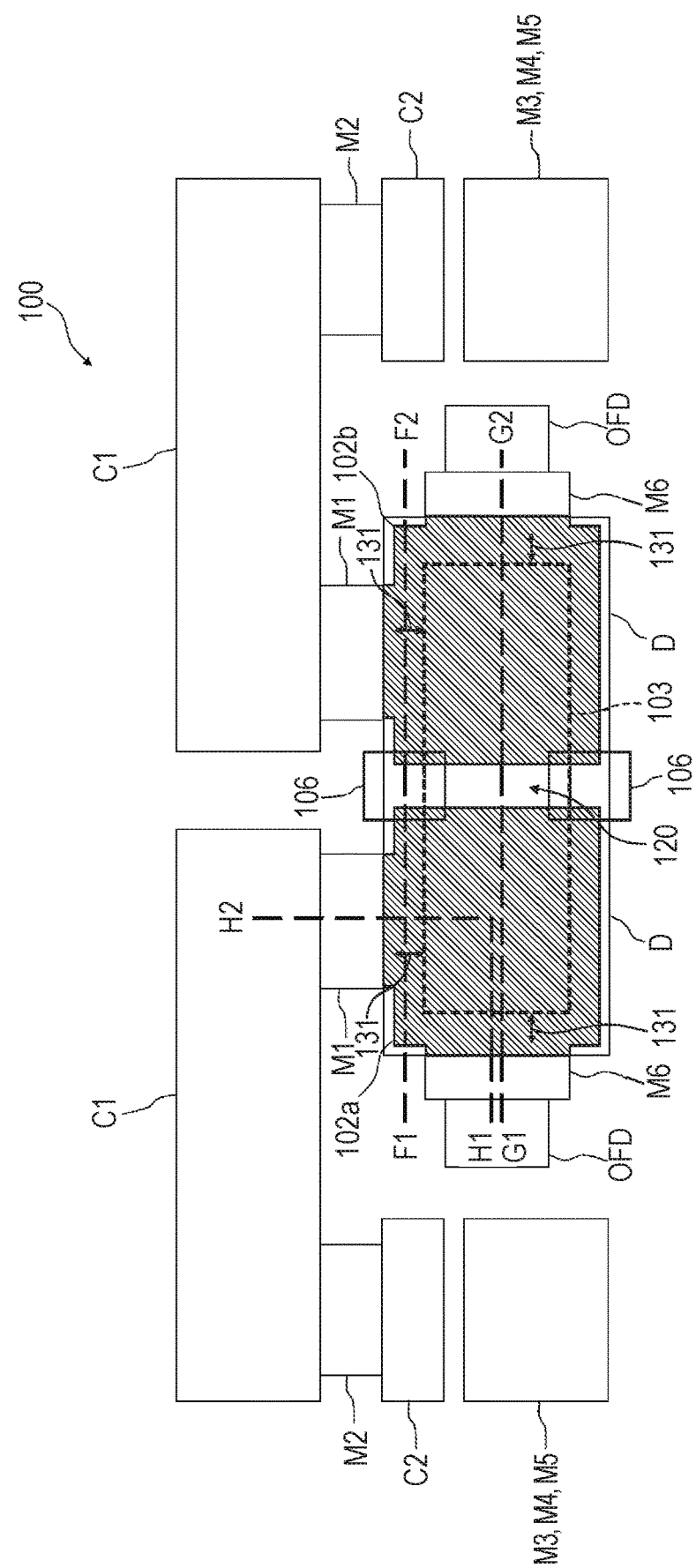
FIG. 24 is a plan view schematically illustrating the structure of the pixel of the solid state imaging device according to the fifth embodiment.

FIG. 24 is a plan view schematically illustrating the structure of the pixel 100 of the solid state imaging device according to the present embodiment. In FIG. 24, the transfer transistors M1 and M2 and the overflow transistor M6 are illustrated by depicting positions where the gate electrodes thereof are provided. Further, in FIG. 24, the reset transistor M3, the amplification transistor M4, and the selection transistor M5 are depicted as a single block illustrating a general arrangement region.

The photoelectric conversion region D, the transfer transistor M1, the holding portion C1, the transfer transistor M2, and the holding portion C2 are arranged within the pixel 100 so as to neighboring each other in this order. The overflow transistor M6 is arranged neighboring the photoelectric conversion region D.

FIG. 24 depicts two N-type charge accumulation regions 102a and 102b (the first charge accumulation region and the second charge accumulation region) forming two photoelectric conversion regions D. As illustrated in FIG. 24, the charge accumulation regions 102a and 102b are spaced apart from each other by a first gap 120. A single micro-lens (not shown) is arranged over these two charge accumulation regions 102a and 102b, and the pixel 100 of the present embodiment may be used as a pixel for focus detection.

The photoelectric conversion region D further has a P-type semiconductor region 103 arranged so as to extend over the charge accumulation region 102a, the first gap 120, and the charge accumulation region 102b. The semiconductor region 103 is arranged at a second depth lower than the charge accumulation regions 102a and 102b arranged at a first depth. The semiconductor region 103 has a function as a depletion suppression layer for suppressing expansion of the depletion layer downward from the charge accumulation regions 102a and 102b.

A large part of the light that has entered the photoelectric conversion region D is absorbed in a region under the charge accumulation regions 102a and 102b and the semiconductor region 103. However, a non-negligible amount of light is absorbed also in the semiconductor region 103. Therefore, also in the semiconductor region 103, pairs of electrons and holes are generated by photoelectric conversion. Although the inside of the semiconductor region 103 is a neutral region and has no electric field, a part of charges generated in the semiconductor region 103 leaks to the holding portion C1 due to diffusion. Leakage of charges generated in the semiconductor region 103 to the holding portion C1 may cause noise to occur. Thus, in the solid state imaging device having the holding portion C1, reduction of charges leaking from the semiconductor region 103 to the holding portion C1 may be an object.

Figure 25:
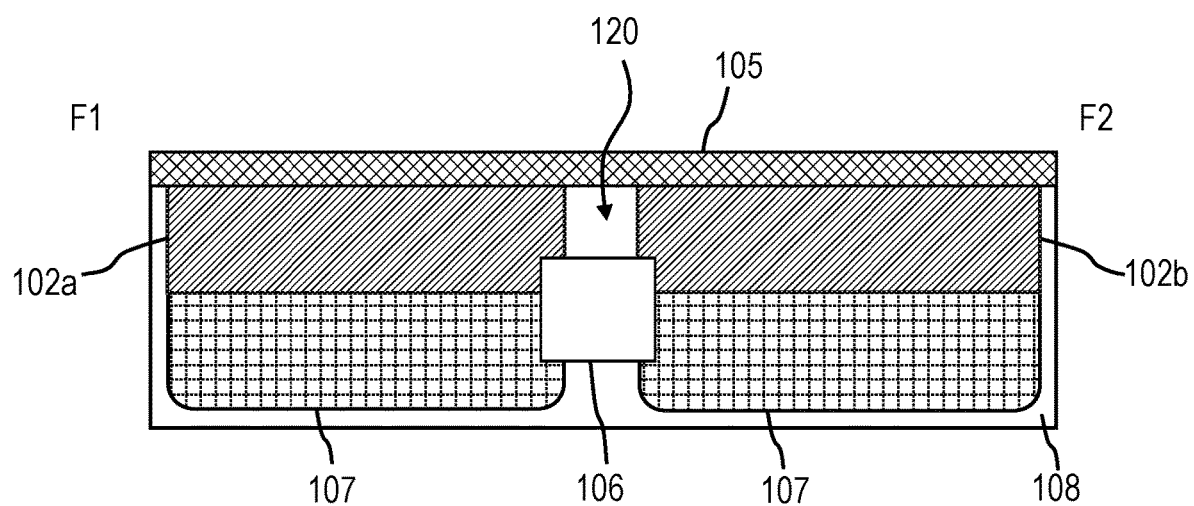
FIG. 25 is a first sectional view schematically illustrating the structure of the pixel of the solid state imaging device according to the fifth embodiment.
Figure 26:
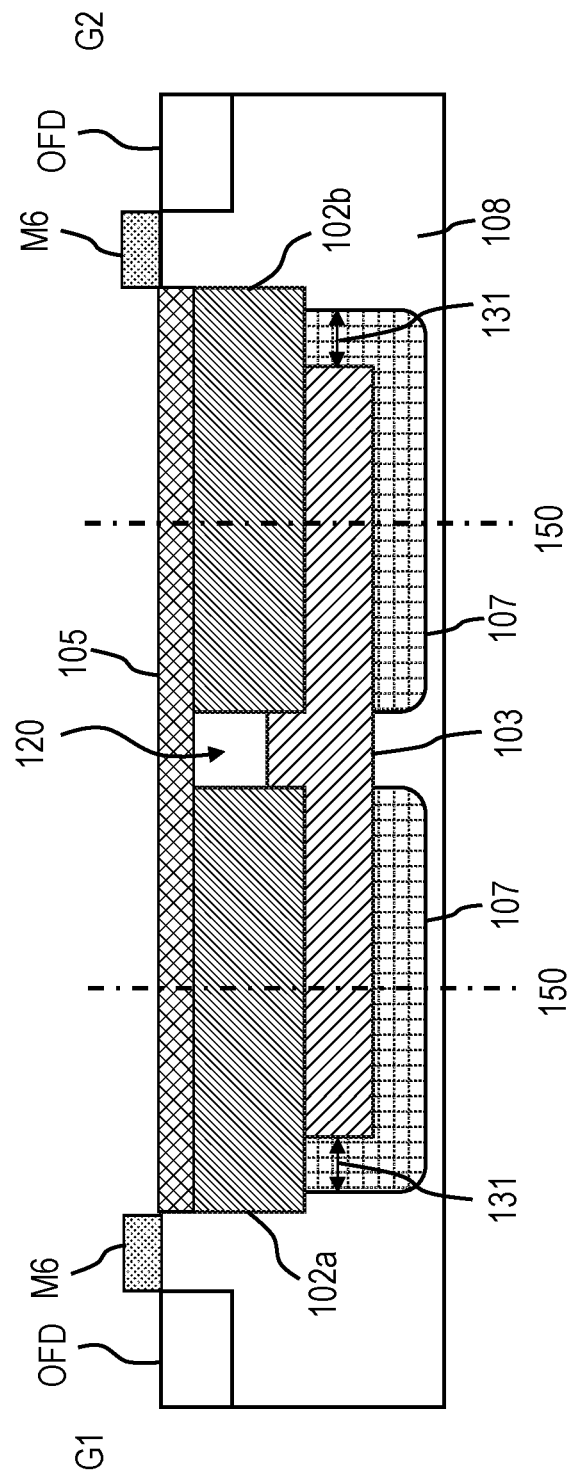
FIG. 26 is a second sectional view schematically illustrating the structure of the pixel of the solid state imaging device according to the fifth embodiment.
Figure 27:
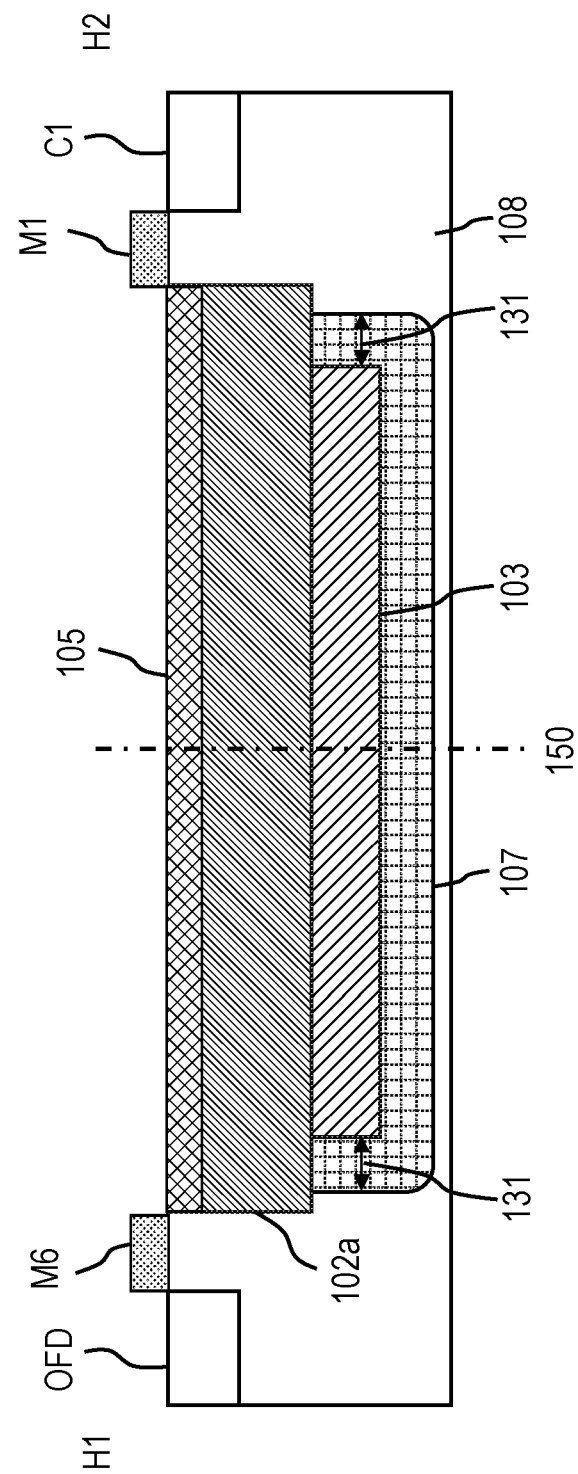
FIG. 27 is a third sectional view schematically illustrating the structure of the pixel of the solid state imaging device according to the fifth embodiment.

FIG. 25 illustrates a sectional view taken along the broken line F1-F2 in FIG. 24. FIG. 26 illustrates a sectional view taken along the broken line G1-G2 in FIG. 24. FIG. 27 illustrates a sectional view taken along the broken line H1-H2 in FIG. 24. Each of axes illustrated by one-dot-chain lines in FIG. 26 and FIG. 27 is a center axis 150 of the photoelectric conversion region D.

As illustrated in FIG. 25 to FIG. 27, an N-type semiconductor region 107 (third semiconductor region) surrounded by the P-type semiconductor region 108 is arranged under the semiconductor region 103. The solid state imaging device in the present embodiment is designed such that most part of the semiconductor region 107 is depleted. Further, the semiconductor region 103 is designed such that depletion does not expand to the entirety. This design can be made by setting the impurity concentration to an appropriate value.

This causes an electric field in a direction perpendicular to the substrate surface to occur between the semiconductor region 103 and the semiconductor region 107. Charges generated by photoelectric conversion in the semiconductor region 103 are attracted to the charge accumulation regions 102a and 102b or the semiconductor region 107 and less are likely to leak to the holding portion C1. This can reduce noise due to leakage of charges to the holding portion C1.

Further, as illustrated in FIG. 26 and FIG. 27, at the depth where the semiconductor region 103 is formed, a third gap 131 is provided between the end of the semiconductor region 103 and the end of the semiconductor region 107. The third gap 131 is a path when charges generated at a region such as the N-type semiconductor region 107 that is deeper than the charge accumulation regions 102a and 102b move to the charge accumulation regions 102a and 102b. Therefore, with the third gap 131 being provided, the light receiving sensitivity is improved compared to a case where the third gap 131 is not provided.

It is preferable for the third gap 131 to be arranged in a position which does not include the center axis 150 of the photoelectric conversion region D and is near the holding portion C1 in a planar view. The light amount of an incident light on or near the center axis 150 of the photoelectric conversion region D is larger than that in other regions. Thus, a large number of charges are generated in the semiconductor region 103 on or near the center axis 150. Since the third gap 131 is provided in a position closer to the position near the holding portion C1 than to the center axis 150 in the photoelectric conversion region D, charges generated on or near the center axis 150 of the photoelectric conversion region D inside the semiconductor region 103 are drawn into the third gap 131 before reaching the holding portion C1. The charges drawn into the third gap 131 move to the charge accumulation region 102a and 102b or the semiconductor region 107. Therefore, with the third gap 131 being arranged as described above, noise due to leakage of charges to the holding portion C1 can be further reduced.

In the same point of view, it is further preferable for the third gap 131 to be arranged in a region which does not overlap with a region that a light enters. For example, a configuration in which no light enters the third gap 131 may be realized by arranging a light-shielding member such as a light-shielding film, a wiring, or the like over the third gap 131 to shield the third gap 131 from light.

In the examples illustrated in FIG. 26 and FIG. 27, the semiconductor region 107 is not arranged under the holding portion C1. However, the semiconductor region 107 may be arranged to extend to reach a portion under the holding portion C1. A portion of a light that has entered the photoelectric conversion region D may enter the portion under the holding portion C1 by scattering or the like. Extension of the semiconductor region 107 to reach the portion under the holding portion C1 results in a wider region where photoelectric conversion may be performed, which allows charges generated under the holding portion C1 to be also collected in the charge accumulation regions 102a and 102b. This can further improve light-receiving sensitivity.

Further, in the present embodiment, as illustrated in FIG. 24 and FIG. 25, there are regions where the semiconductor region 103 is not arranged between the two charge accumulation regions 102a and 102b at or near both the ends of the first gap 120 in a planar view. In these regions, the potential barrier may be lower than in the region where the semiconductor region 103 is arranged. A lower potential barrier results in a smaller saturation charge amount of the charge accumulation regions 102a and 102b due to occurrence of a leak current.

Thus, in the present embodiment, in a similar manner to the second embodiment, the P-type impurity regions 106 are arranged in regions where the semiconductor region 103 is not arranged between the two charge accumulation regions 102a and 102b in the planar view. The impurity concentration of the impurity regions 106 is set so that the potential barrier along the line F1-F2 is equal to or greater than the potential barrier along the broken line G1-G2. This can be achieved by setting the P-type impurity concentration in the impurity regions 106 under the first gap 120 is higher than the P-type impurity concentration in the region under the charge accumulation regions 102a and 102b, for example. Thereby, in a similar manner to the second embodiment, a leak current between the charge accumulation regions 102a and 102b is suppressed, and the saturation charge amount of the charge accumulation regions 102a and 102b can be increased.

As discussed above, according to the present embodiment, a leak current between the charge accumulation regions 102a and 102b can be suppressed in a similar manner to the first to fourth embodiments also in the solid state imaging device of the pixel configuration capable of global electronic shutter. Thereby, the saturation charge amount of the charge accumulation regions 102a and 102b can be increased. Further, in the present embodiment, with the semiconductor region 103 configured as described above, noise due to leakage of charges generated in the semiconductor region 103 to the holding portion C1 can be suppressed.

Note that, in FIG. 24, there are regions where the charge accumulation regions 102a and 102b do not overlap with the semiconductor region 103 at both the ends of the first gap 120, and the impurity regions 106 are formed in the regions. However, this structure may be formed in only one of the ends of the first gap 120.

Sixth Embodiment

Figure 28:
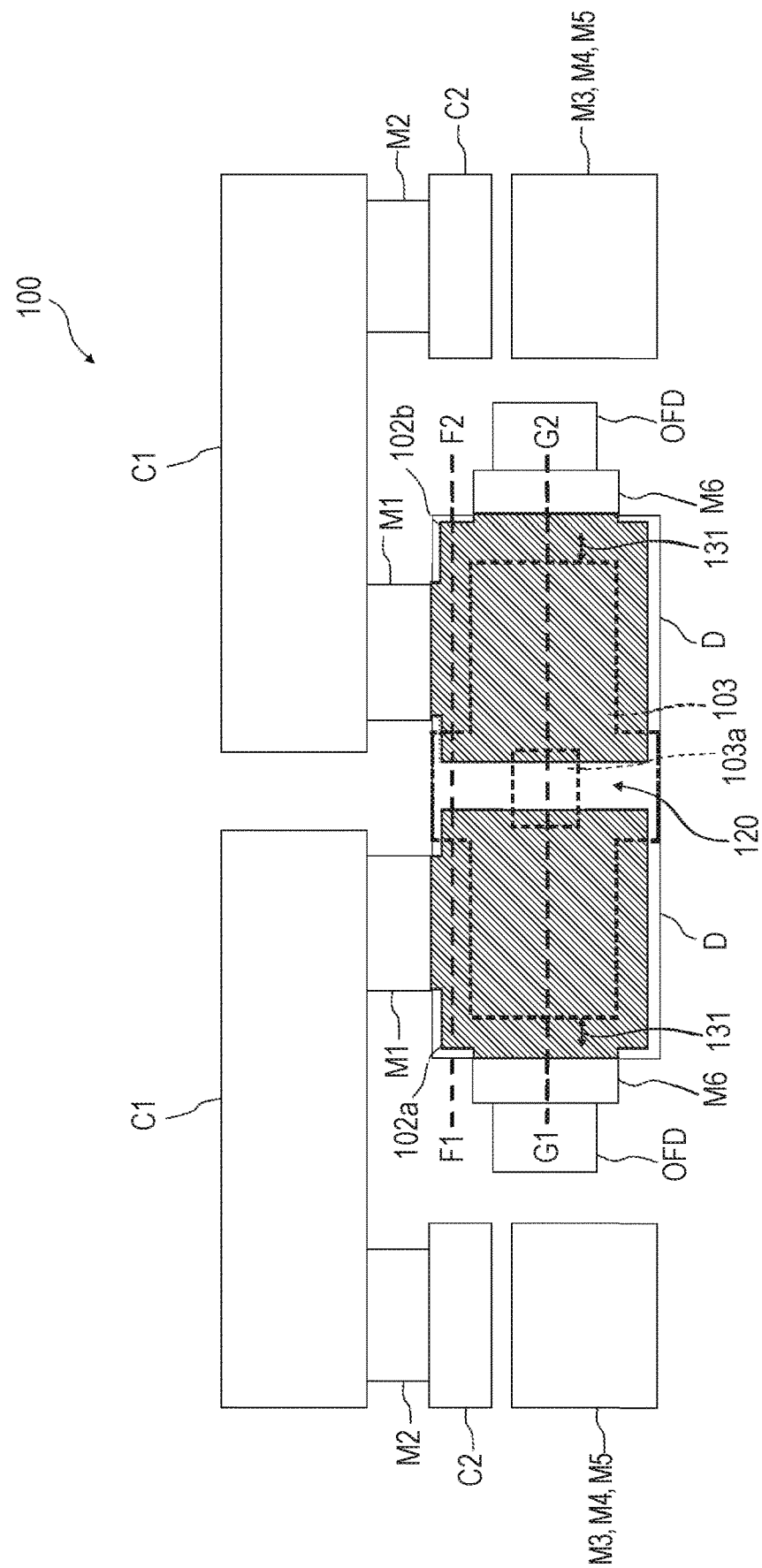
FIG. 28 is a plan view schematically illustrating the structure of the pixel of the solid state imaging device according to a sixth embodiment.

FIG. 28 is a plan view schematically illustrating the structure of the pixel 100 of a solid state imaging device according to the present embodiment. The present embodiment is different from the fifth embodiment in that the shape in the planar view of the semiconductor region 103 is different and that the impurity region 106 is not provided. The external shape of the semiconductor region 103 is a cross in the planar view. The semiconductor region 103 is arranged so as to extend over the charge accumulation regions 102a, the first gap 120, and the charge accumulation regions 102b in the horizontal direction in FIG. 28. Further, the semiconductor region 103 is arranged so as to overlap with the first gap 120 in the vertical direction in FIG. 28. In such a way, in a portion where the first gap 120 and the semiconductor region 103 overlap with each other, the width along the direction in which the first gap 120 of the semiconductor region 103 extends is larger than the width of the remaining portion.

Further, the semiconductor region 103 has a rectangular opening 103a at or near the center thereof. The opening 103a is a region which is masked when an impurity for forming the semiconductor region 103 is implanted. In other words, in the opening 103a, the semiconductor region 103 and the first gap 120 do not overlap with each other. Since other features are the same as those in the fifth embodiment, the description thereof will be omitted. Note that the opening 103a is not a requirement.

Figure 29:
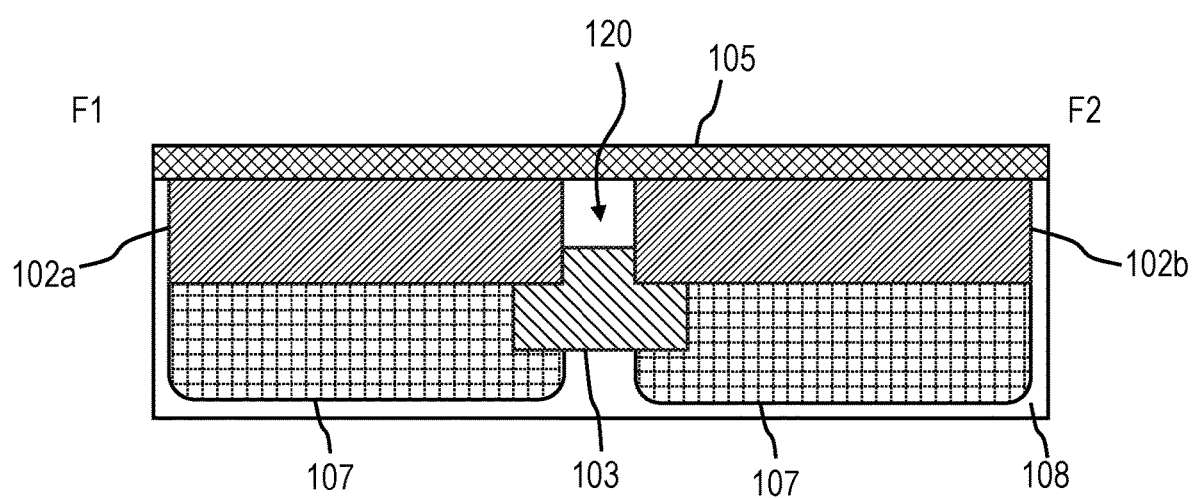
FIG. 29 is a first sectional view schematically illustrating the structure of the pixel of the solid state imaging device according to the sixth embodiment.
Figure 30:
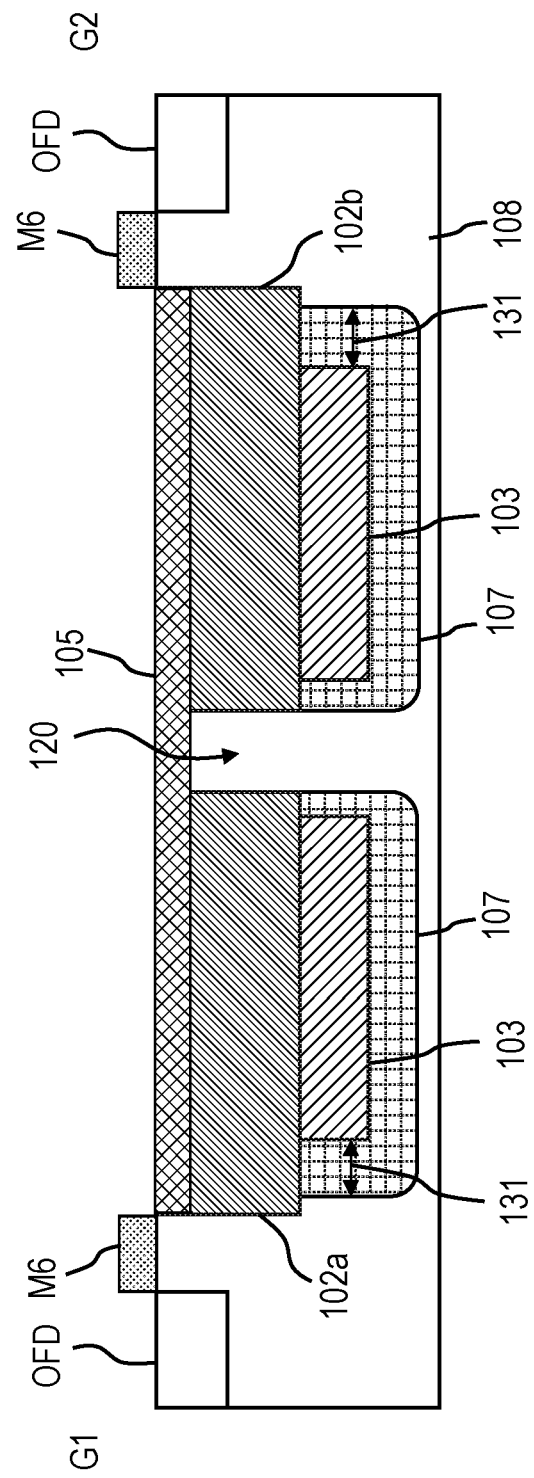
FIG. 30 is a second sectional view schematically illustrating the structure of the pixel of the solid state imaging device according to the sixth embodiment.

FIG. 29 is a sectional view taken along the broken line F1-F2 in FIG. 28. FIG. 30 is a sectional view taken along the broken line G1-G2 in FIG. 28. In FIG. 28 and FIG. 29, elements other than the semiconductor region 103 and the impurity region 106 are the same as those in the fifth embodiment.

In the fifth embodiment, the impurity region 106 is provided for reducing a leak current. In the manufacturing step of such a solid state imaging device, the pattern of the impurity region 106 is formed by an exposure step that is different from the exposure step for the pattern of the semiconductor region 103. Thus, a shift in positioning at patterning may occur between the impurity region 106 and the semiconductor region 103.

In contrast, the solid state imaging device of the present embodiment has the structure in which the semiconductor region 103 instead of the impurity region 106 is formed in a portion between the charge accumulation regions 102a and 102b where the potential barrier is low. In this structure, because of the absence of the impurity region 106, no manufacturing variation occurs due to a shift in positioning described above. On the other hand, because the semiconductor region 103 is formed in the position corresponding to the impurity region 106, the same advantage as in the fifth embodiment can be obtained. As described above, according to the present embodiment, it is possible to reduce manufacturing variation due to a shift in positioning in addition to obtain the same advantage as the fifth embodiment.

Further, in the present embodiment, the semiconductor region 103 has the opening 103a at or near the center. The advantage thereof will be described. Excessive charges generated in the photoelectric conversion region D are drained to a node OFD via the overflow transistor M6. However, excessive draining of charges to the node OFD reduces the saturation charge amount of the charge accumulation regions 102a and 102b.

Thus, excessive charges accumulated in one of the charge accumulation regions 102a and 102b are not only drained to the node OFD but also leaked to the other charge accumulation region, and an advantage of the improved saturation charge amount of the entire charge accumulation regions 102a and 102b may be obtained. In particular, it is preferable that excessive charges generated at a position distant from the overflow transistor M6 be leaked to the other charge accumulation region rather than drained to the node OFD in terms of improvement of the saturation charge amount.

For the reason described above, in the present embodiment, the opening 103a is provided at or near the center of the semiconductor region 103 so as to cause excessive charges generated at or near the center of the semiconductor region 103 to leak to the other charge accumulation region. This improves the saturation charge amount of the charge accumulation regions 102a and 102b.

Seventh Embodiment

Figure 31:
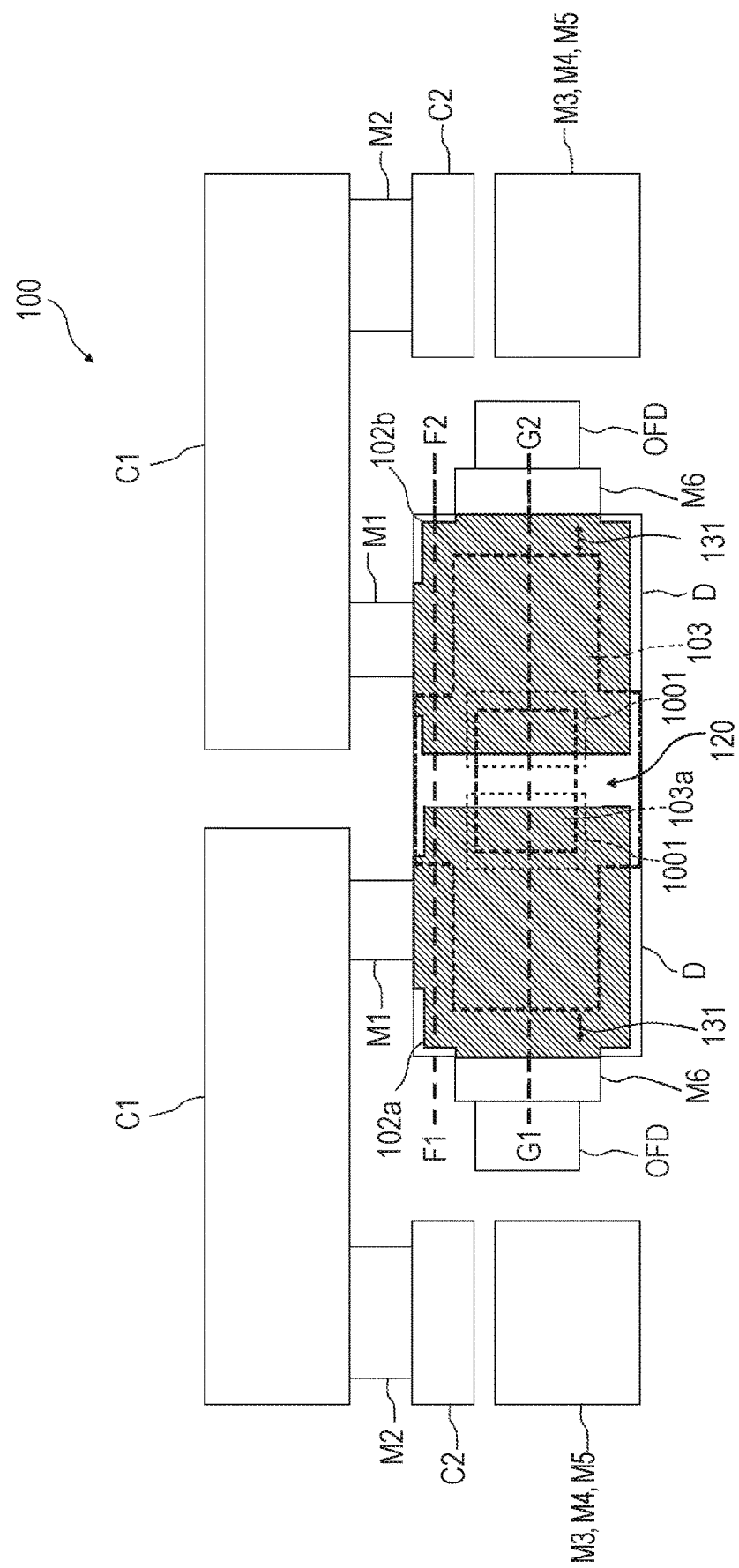
FIG. 31 is a plan view schematically illustrating the structure of the pixel of the solid state imaging device according to a seventh embodiment.

FIG. 31 is a plan view schematically illustrating the structure of the pixel 100 of a solid state imaging device according to the present embodiment. The present embodiment is different from the sixth embodiment in that counter-dope regions 1001 are arranged in portions located at or near the ends of the charge accumulation regions 102a and 102b and substantially overlapping with the opening 103a. The counter-dope region 1001 is a P-type region formed inside the N-type charge accumulation regions 102a and 102b and can be formed by implanting (counter-doping) a P-type impurity. Since other features are the same as those of the sixth embodiment, the description thereof will be omitted.

Figure 32:
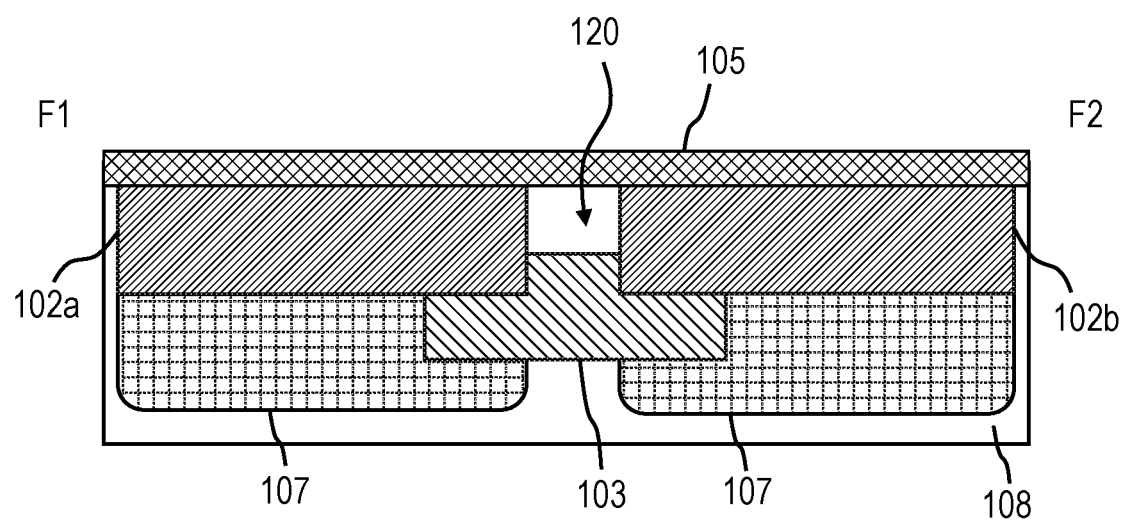
FIG. 32 is a first sectional view schematically illustrating the structure of the pixel of the solid state imaging device according to the seventh embodiment.
Figure 33:
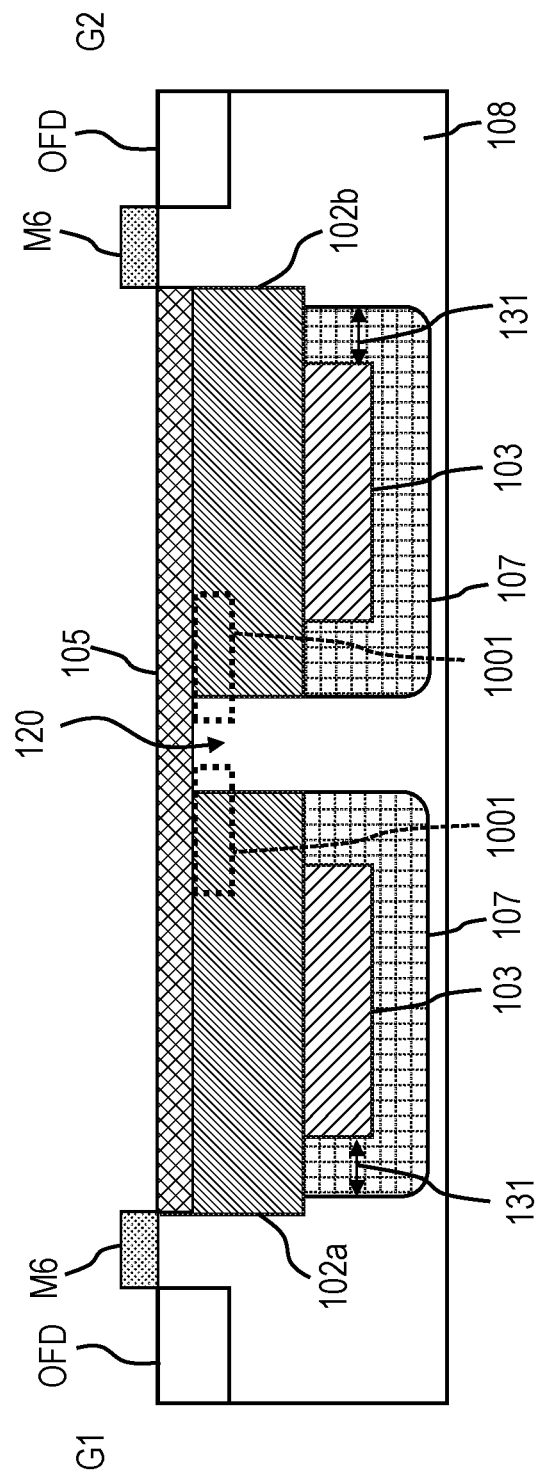
FIG. 33 is a second sectional view schematically illustrating the structure of the pixel of the solid state imaging device according to the seventh embodiment.

FIG. 32 illustrates a sectional view taken along the broken line F1-F2 in FIG. 31. FIG. 33 illustrates a sectional view taken along the broken line G1-G2 in FIG. 31. In FIG. 32 and FIG. 33, the elements other than the counter-dope region 1001 are the same as those of the sixth embodiment.

Figure 34:
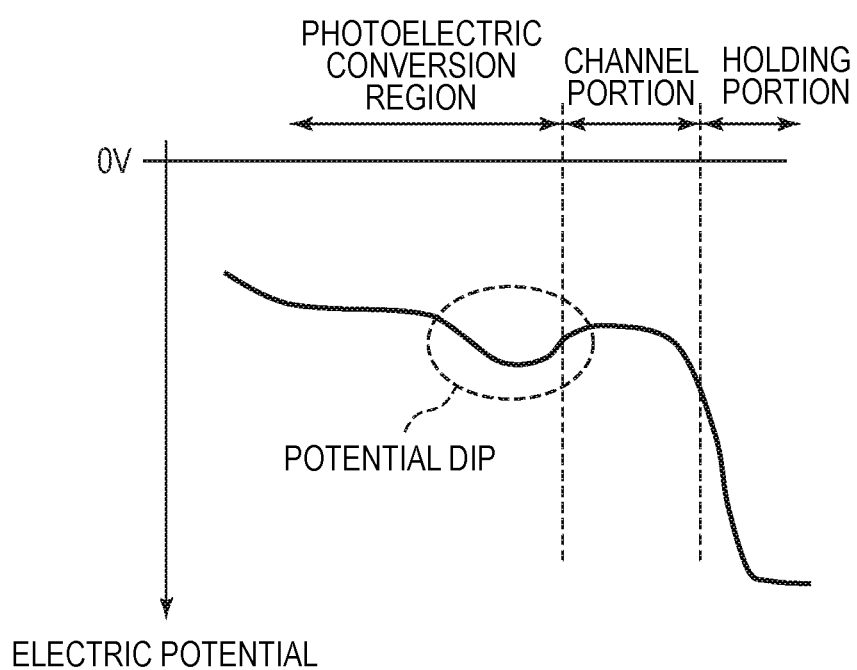
FIG. 34 is a potential diagram inside a semiconductor substrate when signal charges are transferred.
Figure 35:
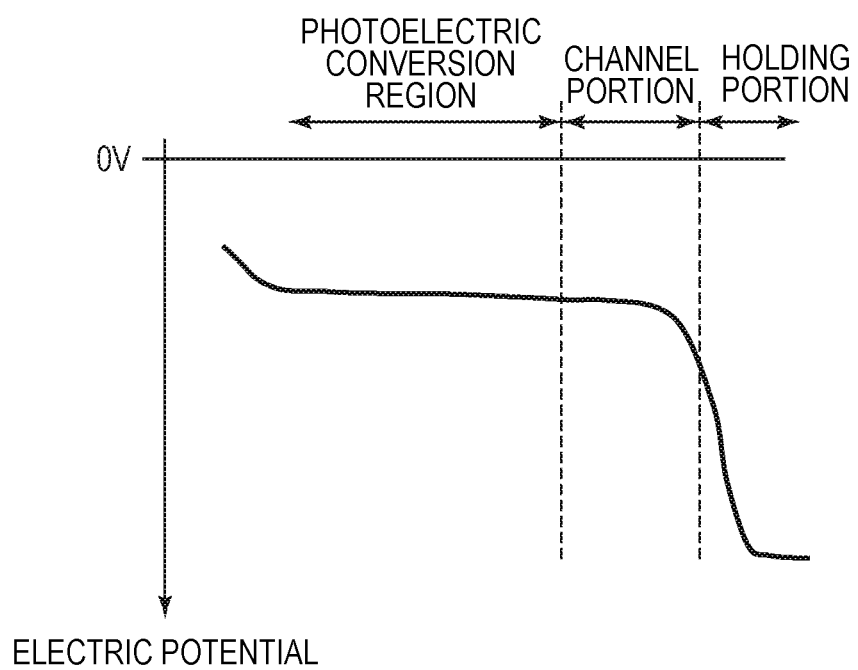
FIG. 35 is a potential diagram inside a semiconductor substrate when signal charges are transferred.

The advantage of providing the counter-dope region 1001 will be described with further reference to FIG. 34 and FIG. 35. FIG. 34 and FIG. 35 are diagrams illustrating the electric potential distribution from the photoelectric conversion region D (charge accumulation region) to the holding portion C1 via a channel portion when the transfer transistor M1 is in an on-state. FIG. 34 is a case where the counter-dope region 1001 is not provided, and FIG. 35 is a case where the counter-dope region 1001 is provided.

With the semiconductor region 103 being arranged under the charge accumulation regions 102a and 102b, relatively large potential dip occurs in the photoelectric conversion region D and the transfer performance decreases as illustrated in FIG. 34. This potential dip occurs to correspond to a portion where the opening 103a is provided. This is because a portion where the charge accumulation regions 102a and 102b overlap with the opening 103a is less likely to be depleted than a portion where the charge accumulation regions 102a and 102b overlap with the semiconductor region 103 in the planar view with respect to the same electric potential. Signal charges are likely to be retained in such a potential dip, which results in a decrease in the transfer performance during a transfer operation.

In view of the above, in the solid state imaging device according to the present embodiment, the counter-dope region 1001 is provided inside the charge accumulation regions 102a and 102b at a location substantially overlaps with the opening 103a in the planar view. With the counter-dope region 1001 being provided, a potential dip in the charge accumulation regions 102a and 102b of the portion where the opening 103a is provided can be reduced as illustrated in FIG. 35. This can suppress signal charges from being retained in a potential dip and improve the transfer performance.

Further, in the solid state imaging device according to the present embodiment, the counter-dope region 1001 covers the entire region where the charge accumulation regions 102a and 102b overlap with the opening 103a in the planar view as illustrated in FIG. 31. Therefore, even when the charge accumulation regions 102a and 102b, the semiconductor region 103, and the counter-dope region 1001 are shifted, the counter-dope region 1001 is arranged over the entire region of the portion where the charge accumulation regions 102a and 102b overlap with the opening 103a in the planar view. Therefore, in the solid state imaging device of the present embodiment, the structure that is less likely to be affected by the manufacturing variation is realized, and a stable transfer performance can be realized.

As described above, according to the present embodiment, it is possible to suppress signal charges from being retained in a potential dip and improve the transfer performance in addition to obtain the same advantages as those in the fifth embodiment and the sixth embodiment.

Eighth Embodiment

Figure 36A:
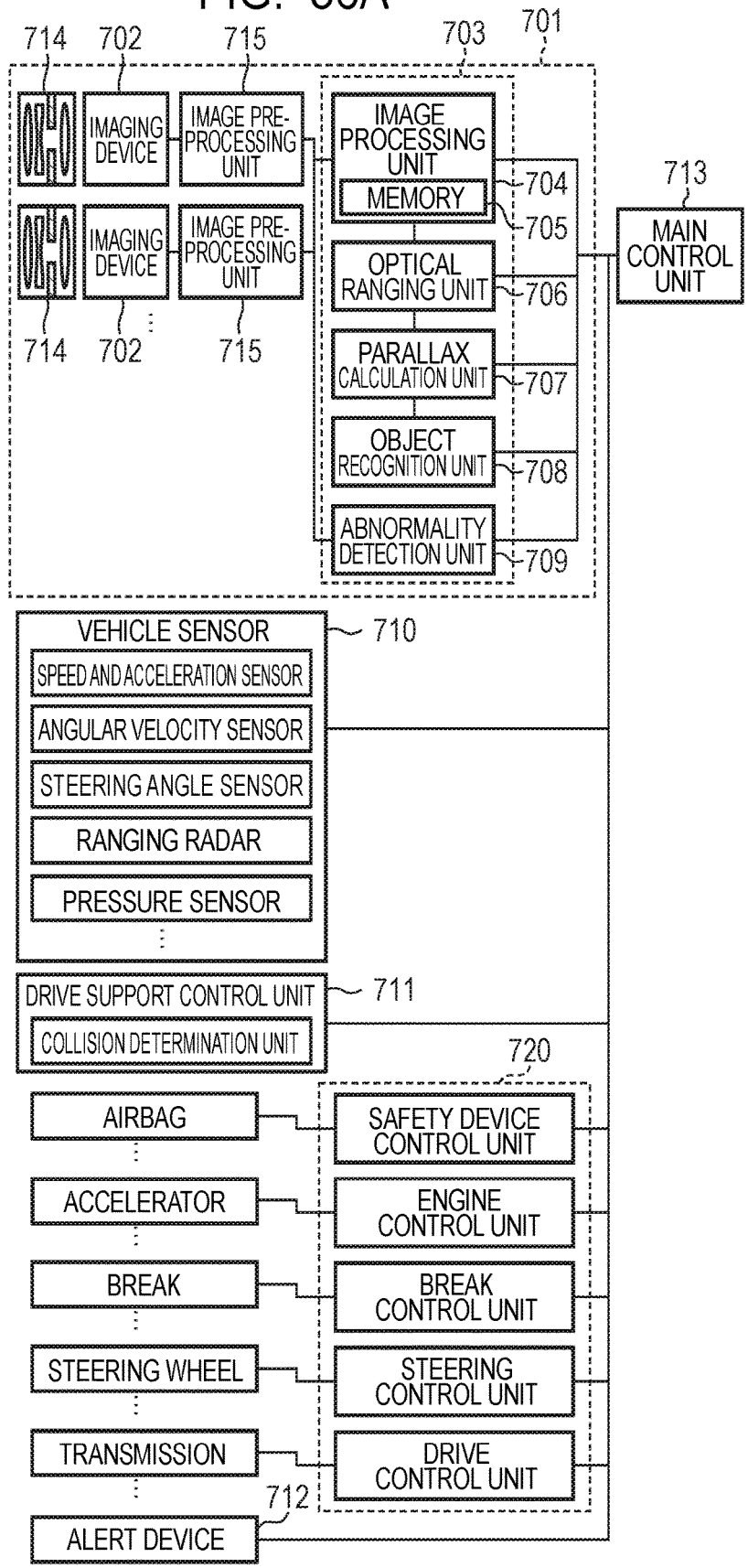
FIG. 36A and FIG. 36B are schematic diagrams illustrating a configuration example of an imaging system and a mobile apparatus according to an eighth embodiment.
Figure 36B:
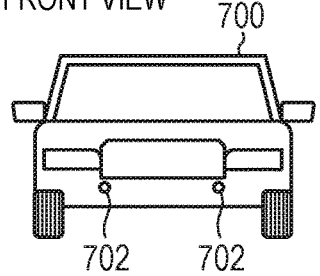
Figure 36B:
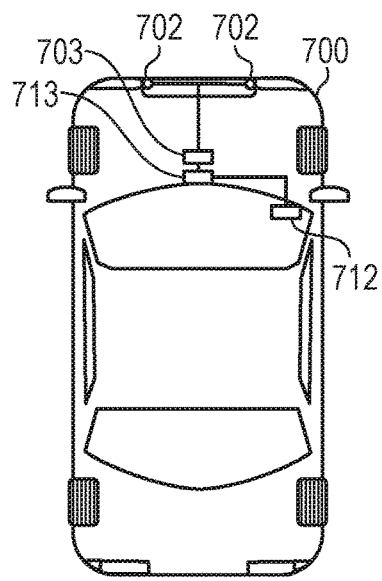
Figure 36B:
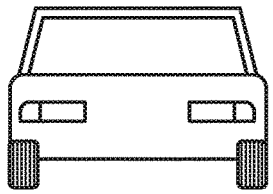

Next, an imaging system and a mobile apparatus according to an eighth embodiment of the present invention will be described by using FIG. 36A and FIG. 36B. FIG. 36A and FIG. 36B are schematic diagrams illustrating a configuration example of an imaging system and a mobile apparatus according to the eighth embodiment.

In the present embodiment, an example of an imaging system related to an on-vehicle camera will be illustrated. FIG. 36A illustrates an example of a vehicle system and an imaging system mounted thereon. An imaging system 701 has imaging devices 702, image preprocessing units 715, an integrated circuit 703, and optical systems 714. Each of the optical systems 714 captures an optical image of an object on the imaging device 702. Each of the imaging devices 702 converts an optical image of an object captured by the optical system 714 into an electrical signal. Each imaging device 702 is an imaging device having any of the photoelectric conversion devices of the embodiments described above. Each of the image preprocessing units 715 performs predetermined signal processing on a signal output from the imaging device 702. The function of the image preprocessing unit 715 may be embedded in the imaging device 702. The imaging system 701 is provided with at least two sets of the optical system 714, the imaging device 702, and the image preprocessing unit 715, and outputs from the image preprocessing units 715 of respective sets are input to the integrated circuit 703.

The integrated circuit 703 is an application specific integrated circuit for the imaging system and includes an image processing unit 704 including a memory 705, an optical ranging unit 706, a parallax calculation unit 707, an object recognition unit 708, and an abnormality detection unit 709. The image processing unit 704 performs image processing such as development process, defection correction, or the like on the output signal from the image preprocessing unit 715. The memory 705 stores primary storage of a captured image or a defection position of a captured image. The optical ranging unit 706 performs focusing or ranging of an object. The parallax calculation unit 707 calculates a parallax (a phase difference of parallax images) from a plurality of image data acquired by the plurality of imaging devices 702. The object recognition unit 708 recognizes an object such as an automobile, a road, a traffic sign, a person, or the like. In response to detection of an abnormality of the imaging device 702, the abnormality detection unit 709 reports the abnormality to a main control unit 713.

The integrated circuit 703 may be implemented by dedicatedly designed hardware, may be implemented by a software module, or may be implemented by the combination thereof. Further, the integrated circuit 703 may be implemented by a Field Programmable Gate Array (FPGA), an Application Specific Integrated Circuit (ASIC), or the like, or may be implemented by the combination thereof.

The main control unit 713 organizes and controls the operation of the imaging system 701, a vehicle sensor 710, a control unit 720, or the like. Note that such a method may be employed that the imaging system 701, the vehicle sensor 710, and the control unit 720 have separate communication interfaces without the main control unit 713 and transmit and receive control signals respectively via the communication network (for example, CAN specification).

The integrated circuit 703 has a function of transmitting a control signal or a setting value to the imaging device 702 in response to receiving the control signal from the main control unit 713 or by using a control unit of the integrated circuit 703. For example, the integrated circuit 703 transmits a setting for pulse-driving the voltage switch in the imaging device 702, a setting for switching the voltage switches on a frame basis, or the like.

The imaging system 701 is connected to the vehicle sensor 710 and can sense a traveling state of the vehicle, such as a vehicle speed, a yaw rate, a steering angle, or the like, and a state of an environment outside the vehicle or another vehicle and an obstacle. The vehicle sensor 710 also serves as a distance information acquisition unit that acquires information on the distance from the parallax image to the object. Further, the imaging system 701 is connected to a drive support control unit 711 that performs various drive supports such as steering, patrol, collision prevention function, or the like. In particular, with respect to the collision determination function, collision estimation and a collision against another vehicle and an obstacle is determined based on the sensing result of the imaging system 701 or the vehicle sensor 710. Thereby, avoidance control when a collision is estimated or startup of a safety device at a collision is performed.

Further, the imaging system 701 is connected to an alert device 712 that issues an alert to a driver based on the determination result in a collision determination unit. For example, when the determination result of the collision determination unit indicates a high possibility of collision, the main control unit 713 performs vehicle control to avoid a collision or reduce damage by applying a break, moving back the accelerator pedal, suppressing the engine power, or the like. The alert device 712 performs an alert to a user by sounding an alert such as a sound, displaying alert information on a display unit such as a car navigation system, a meter panel, or the like, providing a vibration to a sheet belt or a steering wheel.

In the present embodiment, the surrounding area of the vehicle 700, for example, the area in front or rear is captured by the imaging system 701. FIG. 36B illustrates an example arrangement of an imaging system 701 when the area in front of the vehicle is captured by the imaging system 701.

The two imaging devices 702 are arranged in the front of the vehicle 700. Specifically, in terms of acquisition of the distance information or determination of the possibility of collision between the vehicle 700 and the captured object, it is preferable to define the center line with respect to the traveling direction or the external shape (for example, the vehicle width) of the vehicle 700 as a symmetry axis and arrange the two imaging devices 702 in a symmetrical manner with respect to the symmetry axis. Further, it is preferable to arrange the imaging devices 702 so as not to block the driver's field of view when the driver views the surroundings outside the vehicle 700 out of the driver seat. It is preferable to arrange the alert device 712 so as to be easily viewed by the driver.

Modified Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions. That is, the present invention can be implemented in various forms without departing from the technical concept of the invention or the primary feature of the invention. For example, the configurations of respective embodiments described above can be applied in combination.

This application claims the benefit of Japanese Patent Application No. 2017-124067, filed Jun. 26, 2017, and Japanese Patent Application No. 2018-093808, filed May 15, 2018 which are hereby incorporated by reference herein in their entirety.

What is claimed is:

1. A solid state imaging device comprising at least one micro-lens and a pixel including a photoelectric conversion portion provided in a semiconductor substrate,
wherein one micro-lens overlaps with the photoelectric conversion portion in a planar view,
wherein the photoelectric conversion portion generates charges in accordance with an incident light that has transmitted through the one micro-lens,
wherein the photoelectric conversion portion comprises:
a first charge accumulation region of a first conductivity type and a second charge accumulation region of the first conductivity type, the first charge accumulation region and the second charge accumulation region being provided at a first depth of the semiconductor substrate, the first charge accumulation region and the second charge accumulation region being spaced apart from each other by a first gap, and
a first semiconductor region of a second conductivity type and a second semiconductor region of the second conductivity type, the first semiconductor region and the second semiconductor region being provided at a second depth located under the first depth of the semiconductor substrate, each of the first semiconductor region and the second semiconductor region extending over the first charge accumulation region, the first gap, and the second charge accumulation region in the planar view, and
wherein, at the second depth,
an impurity concentration of the second conductivity type in a region under the first gap is higher than an impurity concentration of the second conductivity type in a region under the first charge accumulation region and the second charge accumulation region.

2. The solid state imaging device according to claim 1, wherein focus detection of a phase difference scheme is performed by using a first signal based on signal charges accumulated in the first charge accumulation region and a second signal based on signal charges accumulated in the second charge accumulation region.

3. The solid state imaging device according to claim 1, wherein the first semiconductor region and the second semiconductor region are connected to each other under the first gap.

4. The solid state imaging device according to claim 1 further comprising an impurity region of the second conductivity type at a position shallower than the second depth under the first gap.

5. The solid state imaging device according to claim 4, wherein the impurity region is provided along the first gap.

6. A mobile apparatus comprising:
the solid state imaging device according to claim 1;
an image processing unit configured to process a first signal based on signal charges accumulated in the first charge accumulation region of the pixel and a second signal based on signal charges accumulated in the second charge accumulation region to acquire distance information on a distance to an object; and
a main control unit configured to control the mobile apparatus based on the distance information.

7. A solid state imaging device comprising at least one micro-lens and a pixel including a photoelectric conversion portion provided in a semiconductor substrate,
wherein one micro-lens overlaps with the photoelectric conversion portion in a planar view,
wherein the photoelectric conversion portion generates charges in accordance with an incident light transmitted through the one micro-lens,
wherein the photoelectric conversion portion comprises:
a first charge accumulation region of a first conductivity type and a second charge accumulation region of the first conductivity type, the first charge accumulation region and the second charge accumulation region being provided at a first depth of the semiconductor substrate, the first charge accumulation region and the second charge accumulation region being spaced apart from each other by a first gap, and
a first semiconductor region of a second conductivity type, the first semiconductor region being provided at a second depth located under the first depth of a semiconductor substrate, the first semiconductor region extending over the first charge accumulation region, the first gap, and the second charge accumulation region in the planar view, and
wherein, at the second depth,
of the first gap, an impurity concentration of the second conductivity type in a region under a portion which does not overlap with the first semiconductor region in the planar view is higher than an impurity concentration of the second conductivity type in a region under the first charge accumulation region and the second charge accumulation region.

8. The solid state imaging device according to claim 7, wherein the first semiconductor region does not overlap with the first gap at at least one end of the first gap.

9. The solid state imaging device according to claim 7 further comprising a third semiconductor region of the first conductivity type provided under the first depth,
wherein, at the second depth, an end of the first semiconductor region and an end of the third semiconductor region are spaced apart by a third gap.

10. A manufacturing method of a solid state imaging device having at least one micro-lens and a pixel including a photoelectric conversion portion provided in a semiconductor substrate, one micro-lens overlapping with the photoelectric conversion portion in a planar view, the photoelectric conversion portion generating charges in accordance with an incident light that has transmitted through the one micro-lens, the manufacturing method comprising:
a first step of forming a first charge accumulation region of a first conductivity type and a second charge accumulation region of the first conductivity type at a first depth of the semiconductor substrate, the first charge accumulation region and the second charge accumulation region being spaced apart from each other by a first gap;
a second step of forming a first semiconductor region of a second conductivity type and a second semiconductor region of the second conductivity type at a second depth located under the first depth of the semiconductor substrate, each of the first semiconductor region and the second semiconductor region extending over the first charge accumulation region, the first gap, and the second charge accumulation region in the planar view; and
a third step of forming a semiconductor region of the second conductivity type under the first gap such that an impurity concentration of the second conductivity type in a region under the first gap is higher than an impurity concentration of the second conductivity type in a region under the first charge accumulation region and the second charge accumulation region.

11. The manufacturing method of the solid state imaging device according to claim 10, wherein the second step and the third step are performed in parallel.

12. The manufacturing method of the solid state imaging device according to claim 10, wherein the first semiconductor region and the second semiconductor region are formed to be continuous to each other under the first gap.

13. The manufacturing method of the solid state imaging device according to claim 10 further comprising a step of forming an impurity region of the second conductivity type in a position shallower than the second depth under the first gap.

14. The manufacturing method of the solid state imaging device according to claim 13, wherein the impurity region is formed along the first gap.

* * * * *